(12) United States Patent
Ko et al.

(10) Patent No.: US 10,153,398 B2
(45) Date of Patent: Dec. 11, 2018

(54) LIGHT-EMITTING DEVICE AND MANUFACTURING METHOD THEREOF

(71) Applicant: EPISTAR CORPORATION, Hsinchu (TW)

(72) Inventors: Chun-Teng Ko, Hsinchu (TW);
Chao-Hsing Chen, Hsinchu (TW);
Jia-Kuen Wang, Hsinchu (TW);
Yen-Liang Kuo, Hsinchu (TW);
Chih-Hao Chen, Hsinchu (TW);
Wei-Jung Chung, Hsinchu (TW);
Chih-Ming Wang, Hsinchu (TW);
Wei-Chih Peng, Hsinchu (TW);
Schang-Jing Hon, Hsinchu (TW);
Yu-Yao Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/800,537

(22) Filed: Nov. 1, 2017

(65) Prior Publication Data
US 2018/0130924 A1    May 10, 2018

(30) Foreign Application Priority Data

Nov. 9, 2016   (TW) .............................. 105136453 A

(51) Int. Cl.
*H01L 33/22* (2010.01)
*H01L 33/38* (2010.01)
(Continued)

(52) U.S. Cl.
CPC .......... *H01L 33/22* (2013.01); *H01L 33/0079* (2013.01); *H01L 33/38* (2013.01);
(Continued)

(58) Field of Classification Search
None
See application file for complete search history.

(56) References Cited

U.S. PATENT DOCUMENTS

| 2004/0207092 A1* | 10/2004 | Burrell | H01L 21/76838 257/758 |
| 2010/0078656 A1* | 4/2010 | Seo | H01L 27/156 257/88 |

(Continued)

*Primary Examiner* — Mounir S Amer
(74) *Attorney, Agent, or Firm* — Muncy, Geissler, Olds & Lowe, P.C.

(57) ABSTRACT

A light-emitting device includes a semiconductor stack including a first semiconductor layer, a second semiconductor layer and an active layer formed therebetween; a surrounding exposed region formed on peripheries of the semiconductor stack, exposing a surface of the first semiconductor layer; a conductive layer formed on the second semiconductor layer, including a first conductive region extending toward and contacting the surface of the first semiconductor layer in the surrounding exposed region; an electrode layer formed on the surrounding exposed region, surrounding the semiconductor stack, contacting the conductive layer and including an electrode pad not overlapping the semiconductor stack; an outside insulating layer covering a portion of the conductive layer and the electrode layer, including a first opening exposing the other portion of the conductive layer; a bonding layer covering the outside insulating layer and electrically connecting to the other portion of the conductive layer through the first opening; and a conductive substrate.

18 Claims, 19 Drawing Sheets

(51) Int. Cl.
*H01L 33/46* (2010.01)
*H01L 33/62* (2010.01)
*H01L 33/00* (2010.01)
H01L 33/06 (2010.01)
H01L 33/30 (2010.01)
H01L 33/32 (2010.01)

(52) U.S. Cl.
CPC .............. *H01L 33/46* (2013.01); *H01L 33/62* (2013.01); *H01L 33/06* (2013.01); *H01L 33/30* (2013.01); *H01L 33/32* (2013.01)

(56) References Cited

U.S. PATENT DOCUMENTS

2017/0084787 A1* 3/2017 Emura .................. H01L 33/387
2017/0347418 A1* 11/2017 Son ....................... H01L 33/145

\* cited by examiner

LIGHT-EMITTING DEVICE AND MANUFACTURING METHOD THEREOF

TECHNICAL FIELD

The application relates to a light-emitting device and manufacturing methods thereof, and more particularly, to a light-emitting device with high luminance.

REFERENCE TO RELATED APPLICATION

This application claims the right of priority based on TW Application Serial No. 105136453, filed on Nov. 9, 2016, and the content of which is hereby incorporated by reference in its entirety.

DESCRIPTION OF BACKGROUND ART

Light-Emitting Diode (LED) is an optoelectronic device composed of p-type semiconductor and n-type semiconductor and emitting the light by means of the recombination of carriers at p-n interface. LED has the advantages of small volume, low power consumption, long working lifetime, and fast reaction speed. Therefore, light-emitting diodes are widely used in optical display devices, traffic lights, information storage apparatus, communication devices, illuminant devices and medical instruments.

SUMMARY OF THE APPLICATION

A light-emitting device includes a semiconductor stack including a first semiconductor layer, a second semiconductor layer and an active layer formed therebetween; a surrounding exposed region formed on peripheries of the semiconductor stack, exposing a portion of the first semiconductor layer; a conductive layer formed on the second semiconductor layer, including a first conductive region extending toward and contacting the portion of the first semiconductor layer in the surrounding exposed region; an electrode layer formed on the surrounding exposed region, surrounding the semiconductor stack, contacting the conductive layer and including an electrode pad not overlapping the semiconductor stack; an outside insulating layer covering a portion of the conductive layer and the electrode layer, including a first opening exposing the other portion of the conductive layer; a bonding layer covering the outside insulating layer and electrically connecting to the other portion of the conductive layer through the first opening; and a conductive substrate, wherein the semiconductor stack is located on one side of the bonding layer, and the conductive substrate is located on the other side of the bonding layer.

DETAILED DESCRIPTION OF PREFERRED EMBODIMENTS

Figure 1A:
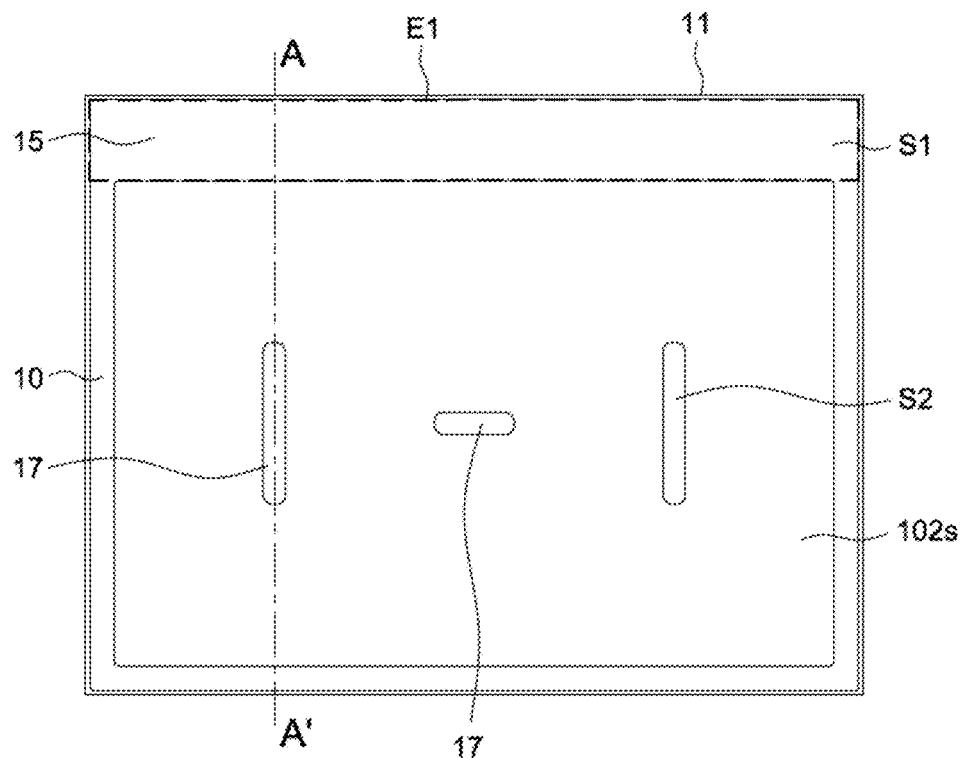
FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, and 12 illustrate a manufacturing method of a light-emitting device 1 in accordance with an embodiment of the present application.

The embodiments of the application are illustrated in detail, and are plotted in the drawings. The same or similar parts are illustrated in the drawings and the specification with the same numbers.

Figure 10A:
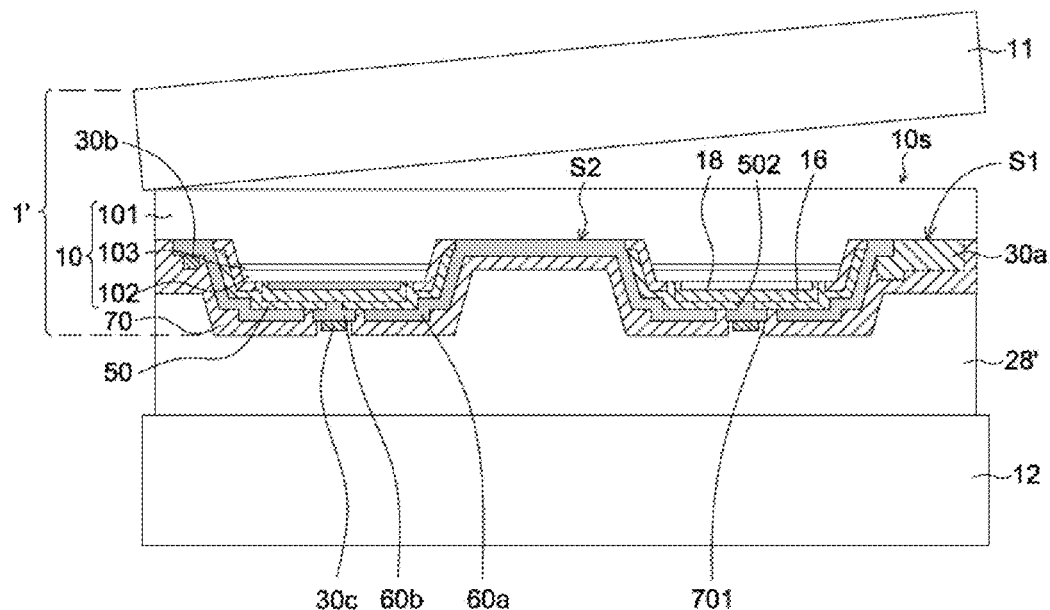
Figure 10B:
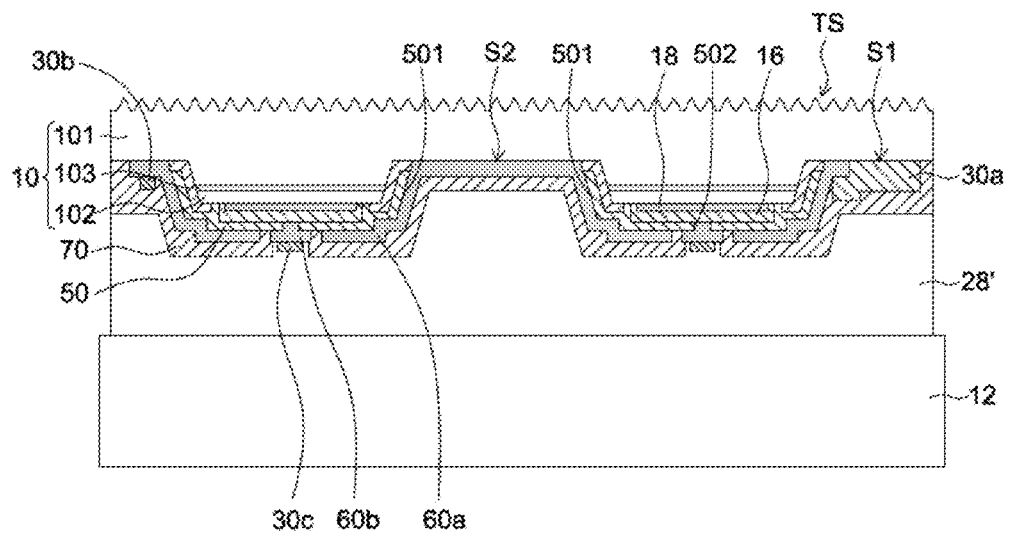
Figure 11A:
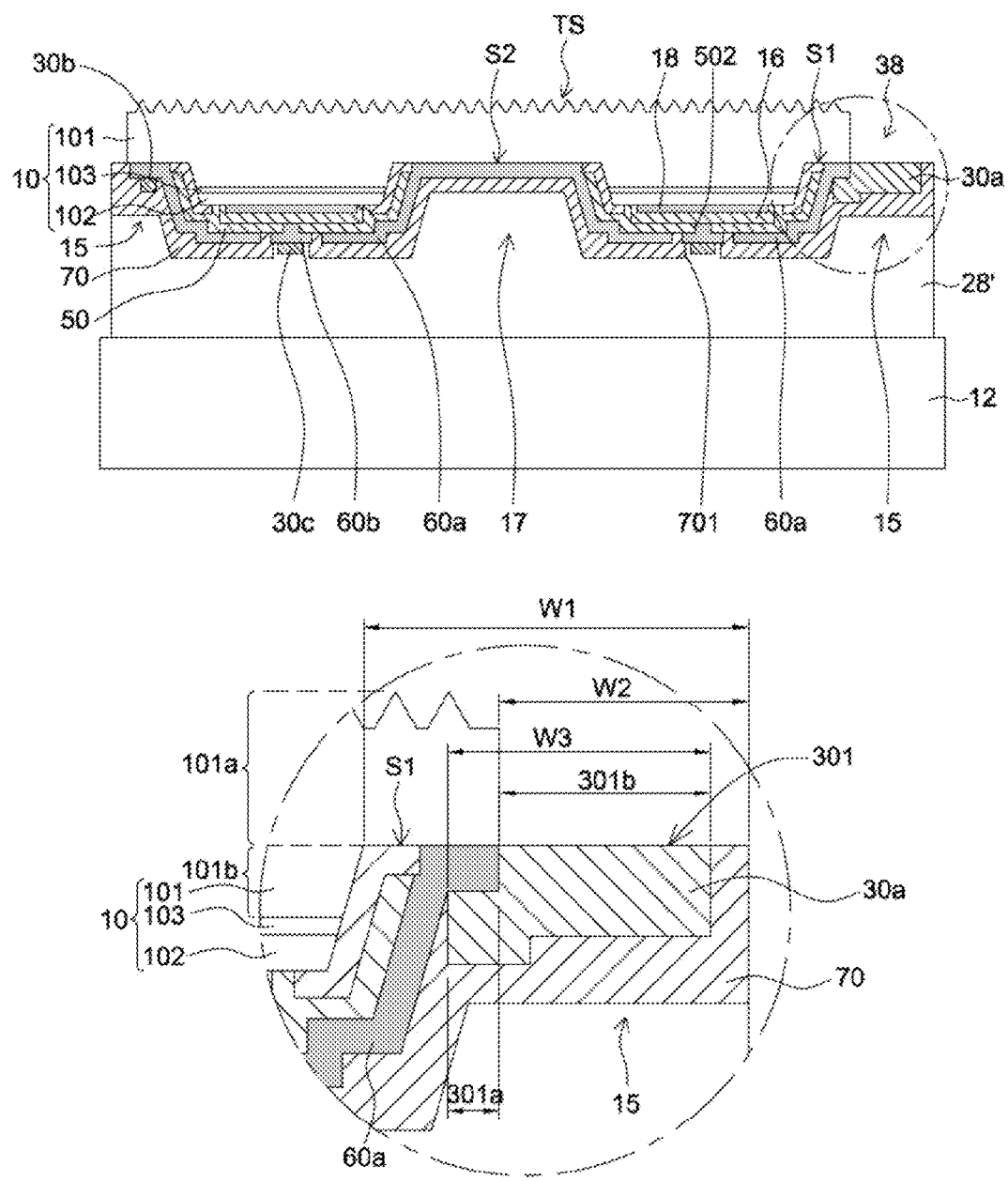
Figure 11B:
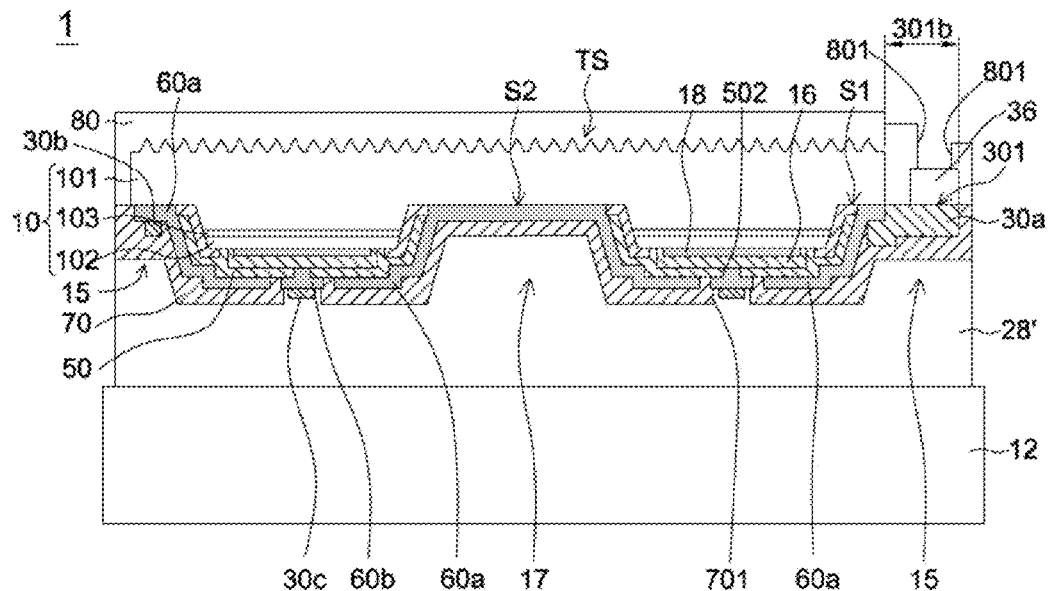

FIG. 11B illustrates a light-emitting device 1 in accordance with an embodiment of the present application. FIGS. 1A to 11B illustrate a manufacturing method of a light-emitting device 1 in accordance with embodiments disclosed in the present application.

Figure 1B:
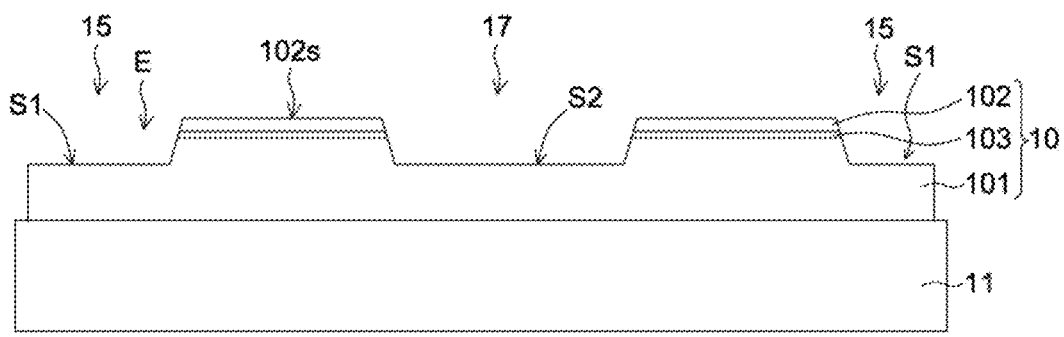

As a top view in FIG. 1A and a cross-sectional view in FIG. 1B which is taken along line A-A' of FIG. 1A show, the manufacturing method of the light-emitting device 1 includes a step of forming a mesa, which includes providing a growth substrate 11 and forming a semiconductor stack 10 on the growth substrate 11. The semiconductor stack 10 includes a first semiconductor layer 101, a second semiconductor layer 102, and an active layer 103 formed between the first semiconductor layer 101 and the second semiconductor layer 102. The semiconductor stack 10 can be patterned by lithography and etching to remove a portion of the second semiconductor layer 102 and the active layer 103 to expose the first semiconductor layer 101 and the side walls of the second semiconductor layer 102 and the active layer 103 to form a plurality of exposed regions, wherein the exposed regions includes a surrounding exposed region 15 formed on the peripheries of the semiconductor stack 10 and one or more via-like exposed regions 17 formed within the semiconductor stack 10. From the top view, the wider region of the surrounding exposed region 15 is a region E1. In the embodiment, portions of the second semiconductor layer 102 and the active layer 103 are removed, and a portion of the first semiconductor layer 101 is further removed to form a first surface S1 in the surrounding exposed region 15 and a second surface S2 in the via-like exposed region 17. The side walls of the first semiconductor layer 101, the second semiconductor layer 102 and the active layer 103 constitute the side walls of the surrounding exposed region 15 and the via-like exposed region 17, while the first surface S1 exposed in the first semiconductor layer 101 constitutes the base surface of the surrounding exposed region 15 and the second surface S2 exposed in the first semiconductor layer 101 constitutes the base surface of the via-like exposed region 17. Form the top view, the surrounding exposed region 15 surrounds both the active layer 103 and the second semiconductor layer 102. The first surface S1 and the second surface S2 can be formed in the same etching process, therefore the first surface S1 and the second surface S2 have the same depth from the top surface $102s$ of the semiconductor stack 10. The shape of the via-like exposed region 17 includes circular shape, elliptical shape, rectangular shape, polygonal shape, or arbitrary shape. In the embodiment, multiple via-like exposed regions 17 are formed and the shape thereof is strip. The arrangement, number and size of the via-like exposed regions 17 can be designed in accordance with the demand of the current distribution and the size of the light-emitting device.

In an embodiment of the present application, the semiconductor stack 10 can includes only the surrounding exposed region 15 without the via-like exposed region 17.

In the embodiment of the present application, the growth substrate 11 can be a wafer-scale substrate or a chip-scale substrate, and the semiconductor stack 10 can be a wafer-scale semiconductor stack or a chip-scale semiconductor stack. The substrate mentioned herein can be, but not limited to, a circular shape, a polygonal shape, or an irregular shape. The substrate mentioned herein can be divided into multiple chip-scale light-emitting devices during the subsequent process, or can directly form a light-emitting device without going through the separation process. For illustrative purposes, the structure, e.g. the growth substrate 11 or the semiconductor stack 10, at each process step shown in the figures of the present application is presented by a single light-emitting device, but not limited thereto. The mesa-forming step and the subsequent processes can be performed on the wafer-level substrate.

In an embodiment of the present application, the growth substrate 11 can be a gallium arsenide (GaAs) substrate for growing aluminum gallium indium phosphide (AlGaInP), a sapphire ($Al_2O_3$) substrate, a gallium nitride (GaN) substrate or a silicon carbide (SiC) substrate for growing indium gallium nitride (InGaN). The surface of the growth substrate 11 for growing the semiconductor stack 10 can be patterned (not shown in the figures). Furthermore, the semiconductor stack 10 with optical characteristics, such as light-emitting stack, can be formed on the growth substrate 11 by organic metal chemical deposition (MOCVD), molecular beam epitaxy (MBE), hydride deposition (HVPE), evaporation or ion plating.

In an embodiment of the present application, a buffer layer (not shown in the figures) can be formed on the growth substrate 11 prior to forming the semiconductor stack 10. The buffer layer could reduce the mismatch of the lattice constant between the growth substrate 11 and the semiconductor stack 10 to improve the epitaxial quality.

In an embodiment of the present application, the first semiconductor layer 101 and the second semiconductor layer 102 have different conductive properties, electrical properties, polarities or dopants to provide the holes and electrons respectively. The polarity can be n type or p type, rendering the holes and the electrons to recombine within the active layer 103 to produce the light. For example, the first semiconductor layer 101 can be n-type semiconductor layer and the second semiconductor layer 102 can be p-type semiconductor layer. The material of the semiconductor stack 10 includes III-V semiconductor material, such as $Al_xIn_yGa_{(1-x-y)}N$ or $Al_xIn_yGa_{(1-x-y)}P$, wherein $0 \leq x$, $y \leq 1$; $(x+y) \leq 1$. According to the material of the active layer 103, when the material of the semiconductor stack 10 is AlInGaP series material, red light with a wavelength between 610 nm and 650 nm or green light with a wavelength between 530 nm and 570 nm can be emitted. When the material of the semiconductor stack 10 is InGaN series material, blue light with a wavelength between 450 nm and 490 nm can be emitted. When the material of the semiconductor stack 10 is AlGaN or AlGaInN series material, UV light with a wavelength between 400 nm and 250 nm can be emitted. The active layer 103 can be a single heterostructure (SH), a double heterostructure (DH), a double-side double heterostructure (DDH), or a multi-quantum well structure, MQW). The material of the active layer 103 can be an undoped, a p-type doped, or a n-type doped semiconductor.

Figure 2A:
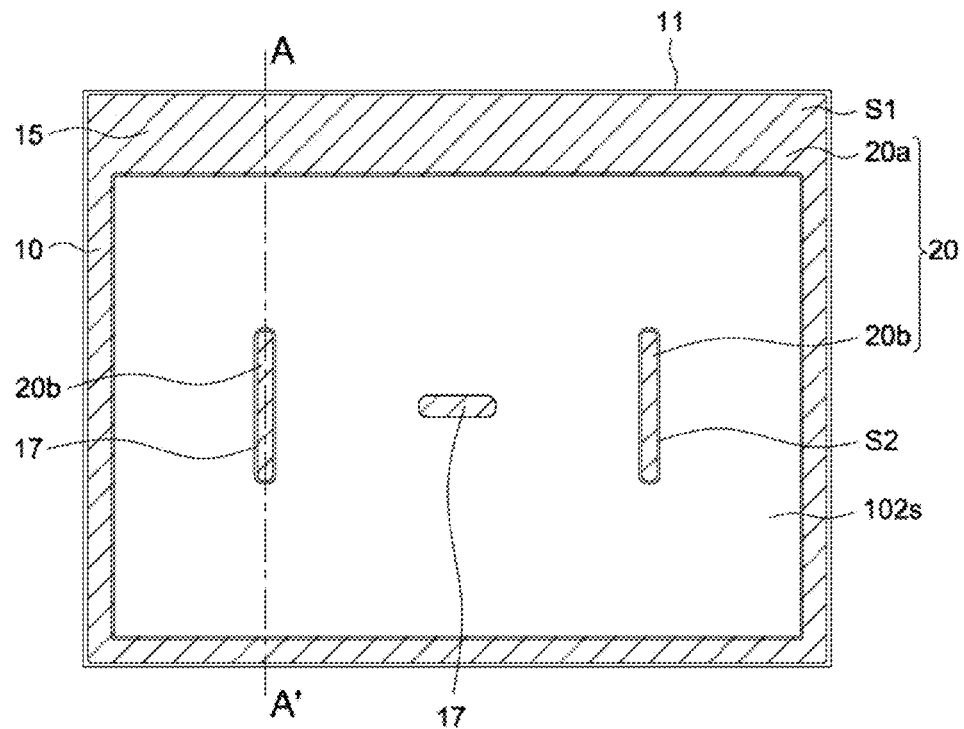
Figure 2B:
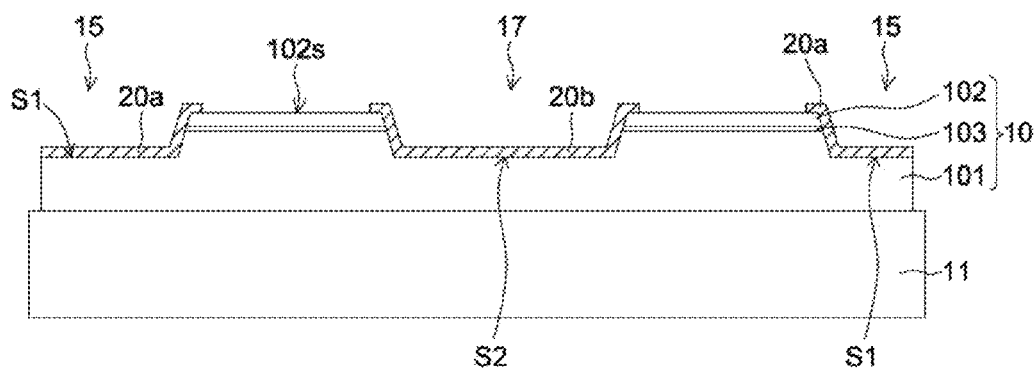

Following the step of forming the mesa, as a top view in FIG. 2A and a cross-sectional view in FIG. 2B which is taken along line A-A' of FIG. 2A show, the manufacturing method of the light-emitting device 1 includes a step of forming a first insulating layer 20. The first insulating layer 20 can be formed by depositing an insulating material layer on the semiconductor stack 10 by evaporation, deposition, etc., and then patterning it by lithography and etching. The first insulating layer 20 covers the first surface S1 in the surrounding exposed region 15 and the second surface S2 in the via-like exposed region 17, and covers the side wall of the semiconductor stack 10. The first insulating layer 20 includes a first insulating surrounding region 20a covering the first surface S1 of the first semiconductor layer 101 and the side wall of the semiconductor stack 10 in the surrounding exposed region 15, and a first insulating covering region 20b covering the second surface S2 of the first semiconductor layer 101 and the side wall of the semiconductor stack 10 in the via-like exposed region 17. The first insulating covering regions 20b are separated from one another and correspond to the multiple via-like exposed regions 17 respectively. The first insulating layer 20 can include only single layer. When the first insulating layer 20 includes only single layer, the first insulating layer 20 can protect the sidewall of the semiconductor stack 10 and prevent the active layer 103 from being damaged by the following processes. When multiple first insulating layers 20 are formed on the semiconductor stack 10, besides protecting the sidewall of the semiconductor stack 10, the multiple first insulating layers 20 can include two or more layers having different refractive indexes alternately stacked to form a Distributed Bragg reflector (DBR), which can selectively reflect light with a specific wavelength. The one or multiple first insulating layers 20 are formed of a non-conductive material which includes organic material, such as Sub, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide or fluorocarbon polymer, inorganic material, such as silicone, glass or dielectric material, such as aluminum oxide ($Al_2O_3$), silicon nitride ($SiN_x$), silicon oxide ($SiO_x$), titanium oxide ($TiO_x$), or magnesium fluoride ($MgF_x$).

Figure 3A:
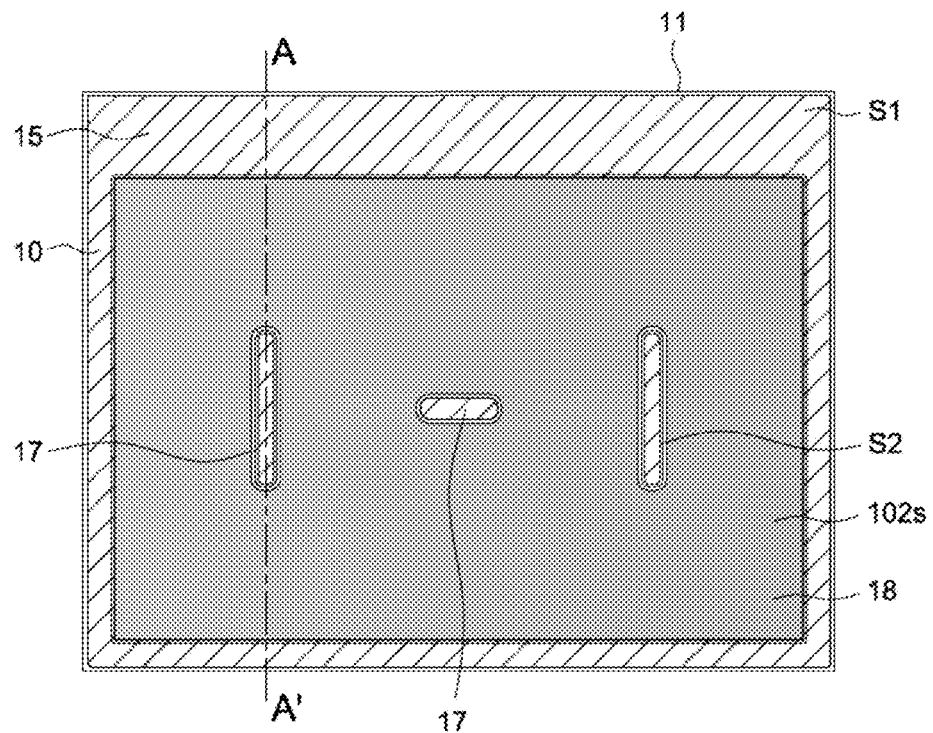
Figure 3B:
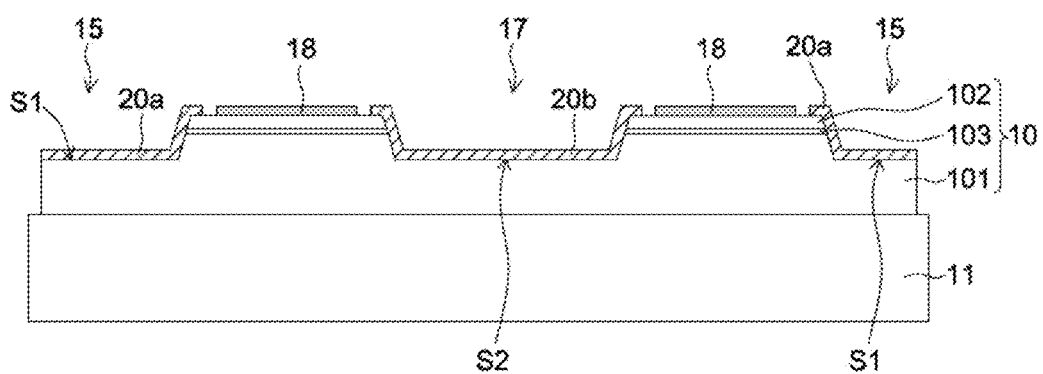

In an embodiment of the present application, following the step of forming the first insulating layer 20, as a top view in FIG. 3A and a cross-sectional view in FIG. 3B which is taken along line A-A' of FIG. 3A show, the manufacturing method of the light-emitting device 1 includes a step of forming a current spreading layer 18. The current spreading layer 18 can be formed, by evaporation, deposition, etc., on the second semiconductor layer 102 uncovered by the first insulating layer 20, and electrically contact the semiconductor layer 102. The current spreading layer 18 can be a metal or a transparent conductive material, wherein the metal can be the translucent thin metal layer, and the transparent conductive material can be transparent to the light emitted from the active layer 103, such as Indium Tin Oxide (ITO), Aluminum Zinc Oxide (AlZO), Gallium Zinc Oxide (GZO) or Indium Zinc Oxide (IZO) and so on.

In an embodiment of the present application, after the step of forming the mesa, the step of forming the current spreading layer 18 can be performed first and then followed by the step of forming the first insulating layer 20.

In an embodiment of the present application, after the step of forming the mesa, the step of forming the first insulating layer 20 can be omitted so that the step of forming the current spreading layer 18 can be directly performed.

Figure 4A:
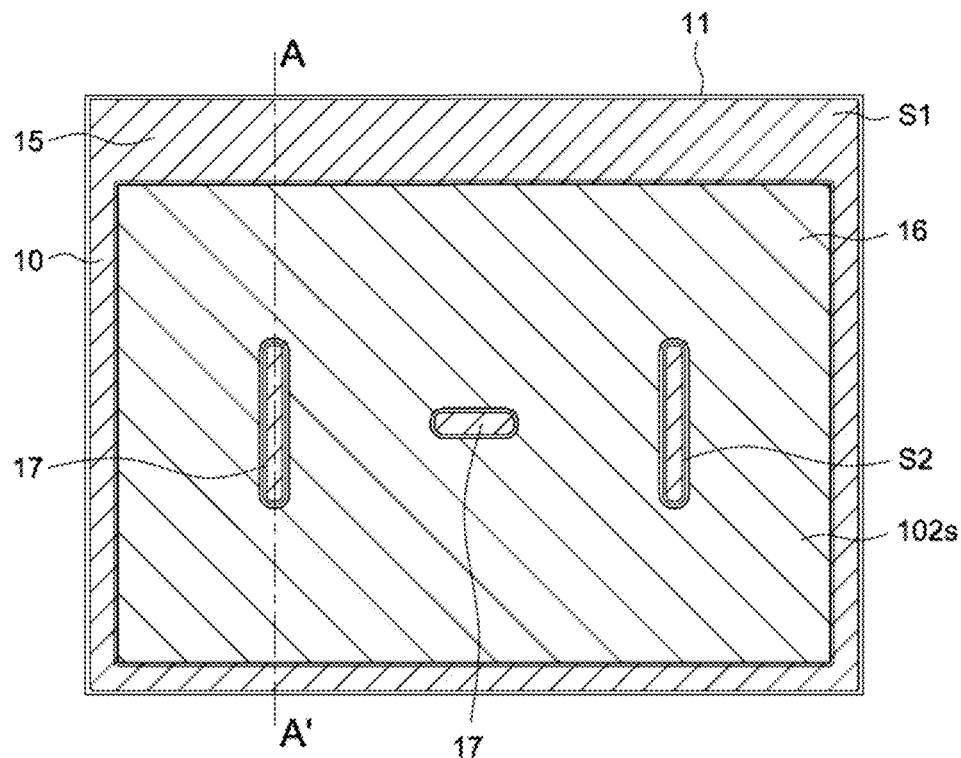
Figure 4B:
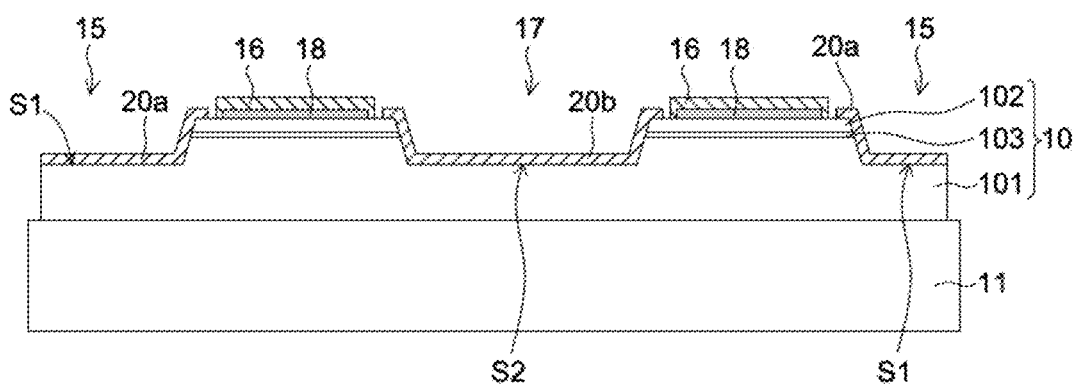

Following the step of forming the current spreading layer 18, as a top view in FIG. 4A and a cross-sectional view in FIG. 4B which is taken along line A-A' of FIG. 4A show, the manufacturing method of the light-emitting device 1 includes a step of forming a reflective structure 16. The reflective structure 16 can include a reflective layer (not shown in the figures) and/or a barrier layer (not shown in the figures), which can be directly formed on the current spreading layer 18 by evaporation, deposition, etc., wherein the reflective layer is formed between the current spreading layer 18 and the barrier layer (not shown in the figures). In the embodiment of the present application, as the top view in FIG. 4A shows, an outer edge of the reflective structure 16 can be disposed on the inner side or the outer side of the outer edge of the current spreading layer 18 or disposed to align the outer edge of the current spreading layer 18, and the outer edge of the barrier layer can be disposed on the inner side or the outer side of the outer edge of the reflective layer or disposed to align the outer edge of the reflective layer. In another embodiment of the present application, the current spreading layer 18 can be omitted so that the reflective structure 16 can be directly formed on the second semiconductor layer 102.

The reflective layer can include only single layer or the multiple reflective layers, such as a Distributed Bragg reflector (DBR), are formed on the current spreading layer 18. The material of the reflective layer includes a metal material having a high reflectance, for example, silver (Ag), aluminum (Al), gold (Au), titanium (Ti), copper (Cu), platinum (Pt), nickel (Ni) or rhodium (Rh), or an alloy of the above materials. The high reflectance referred to herein means having 80% or more reflectance for a wavelength of a light emitted from the active layer 103. In an embodiment of the present application, the barrier layer covers the reflective layer to prevent the surface of the reflective layer from being oxidized that deteriorates the reflectivity of the reflective layer. The material of the barrier layer includes metal material, such as titanium (Ti), tungsten (W), aluminum (Al), indium (In), tin (Sn), nickel (Ni), platinum (Pt), chromium (Cr) or zinc (Zn), or an alloy of the above materials. In an embodiment, the reflective layer is covered by one barrier layer. In another embodiment, the reflective layer is covered by multiple barrier layers, such as titanium (Ti)/aluminum (Al) and/or titanium (Ti)/tungsten (W).

Figure 5A:
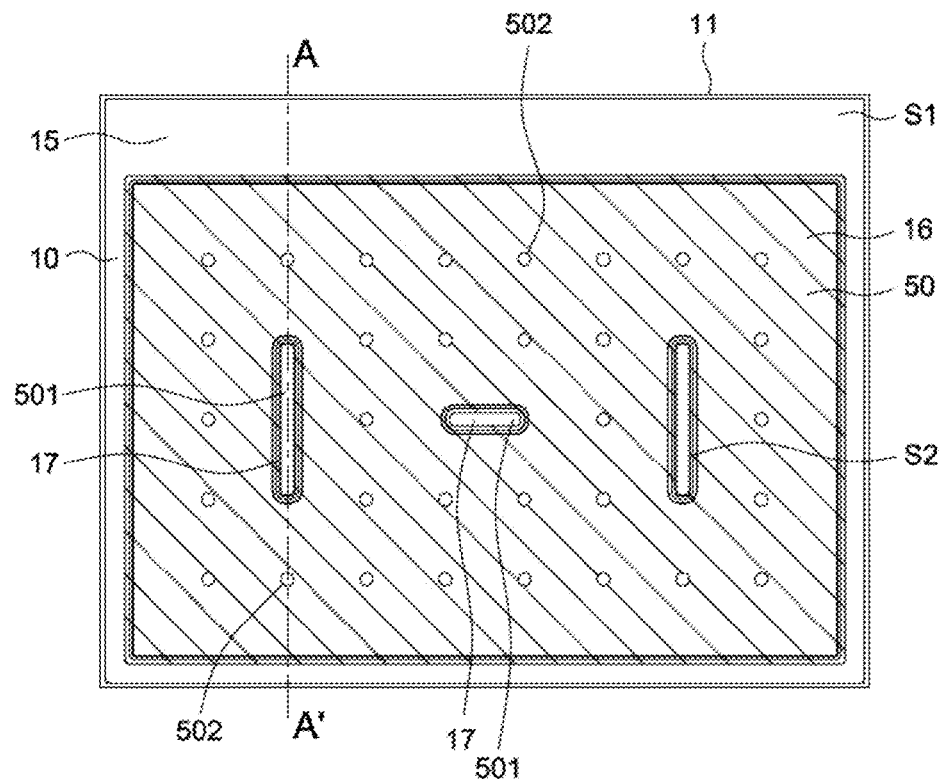
Figure 5B:
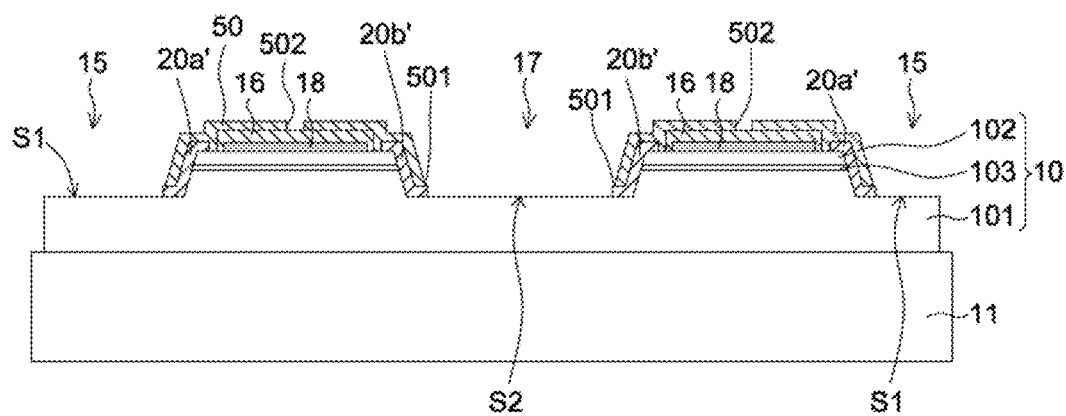

Following the step of forming the reflective structure 16, as a top view in FIG. 5A and a cross-sectional view in FIG. 5B which is taken along line A-A' of FIG. 5A show, the manufacturing method of the light-emitting device 1 includes a step of forming a second insulating layer 50. The second insulating layer 50 can be formed by depositing an insulating material layer on the semiconductor stack 10 by evaporation, deposition, etc., and then patterning it by lithography and etching. The second insulating layer 50 includes a first group of second insulating openings 501 to expose the first semiconductor layer 101 and a second group of second insulating openings 502 to expose the reflective structure 16. During the patterning of the second insulating layer 50, the first insulating surrounding region 20a covering the surrounding exposed region 15 and the first insulating covering regions 20b formed in the via-like exposed region 17 are partially etched and removed to expose the first surface 51 and the second surface S2 of the first semiconductor layer 101 so as to form the first group of second insulating openings 501, a first insulating surrounding region 20a' and a first insulating covering regions 20b'. In the embodiment, as the top view in FIG. 5A show, the widths or numbers of the first group of second insulating openings 501 are different from that of the second group of second insulating openings 502. The shape of the first group of second insulating openings 501 and the second group of second insulating openings 502 includes circular shape, elliptical shape, rectangular shape, polygonal shape or arbitrary shape. In the embodiment, as FIG. 5A shows, the first group of second insulating openings 501 is strip, separated from one another, and corresponding to the multiple via-like exposed regions 17; the second group of second insulating openings 502 is circle, separated from one another, and distributed around the first group of second insulating openings 501 to form a matrix.

When the second insulating layer 50 includes only single layer, the second insulating layer 50 protects the sidewalls of the semiconductor stack 10 and prevents the active layer 103 from being damaged by subsequent processes. When multiple second insulating layers 50 are formed on the semiconductor stack 10, the multiple second insulating layers 50 can protect the sidewall of the semiconductor stack 10 and include two or more layers having different refractive index materials alternately stacked to form a Distributed Bragg reflector (DBR), which can selectively reflect light with a specific wavelength. The second insulating layer 50 is formed of a non-conductive material which includes organic material, such as Sub, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide or fluorocarbon polymer, or inorganic material, such as silicone, glass or dielectric material, such as aluminum oxide ($Al_2O_3$), silicon nitride ($SiN_x$), silicon oxide ($SiO_x$), titanium oxide ($TiO_x$), niobium oxide ($Nb_2O_5$) or magnesium fluoride ($MgF_x$).

Figure 6A:
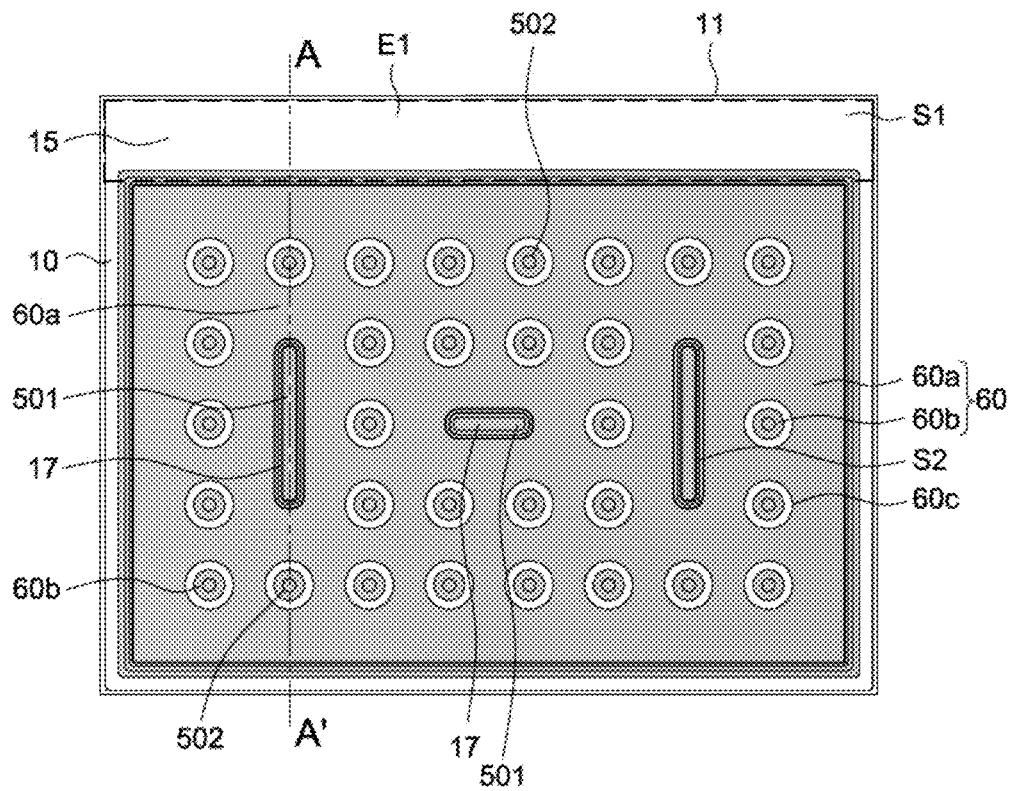
Figure 6B:
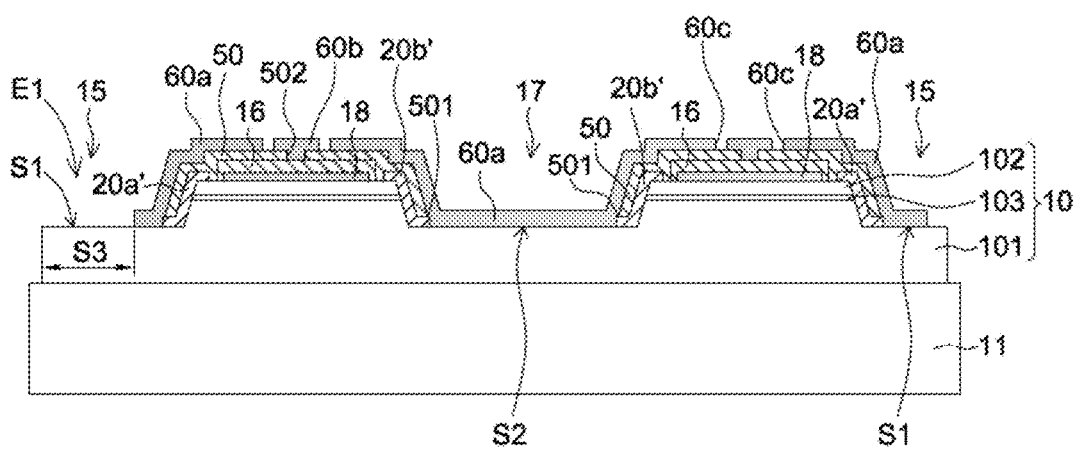

Following the step of forming the second insulating layer 50, as a top view in FIG. 6A and a cross-sectional view in FIG. 6B which is taken along line A-A' of FIG. 6A show, the manufacturing method of the light-emitting device 1 includes a step of forming a conductive layer 60. The conductive layer 60 can be formed by depositing a conductive material layer on the first semiconductor layer 101 and the second semiconductor layer 102 by evaporation, deposition, etc., and then patterning it by lithography and etching. As FIG. 6A shows, the conductive layer 60 includes a first conductive region 60a and a second conductive region 60b spatially separated from the first conductive region 60a by a ring-shaped slit 60c. The first conductive region 60a of the conductive layer 60 contacts the first semiconductor layer 101 (i.e. the first surface S1) in the surrounding exposed region 15 and the first semiconductor layer 101 (i.e. the second surface S2) in all via-like exposed regions 17 through the first group of second insulating openings 501, and extends and covers the side walls of the surrounding exposed region 15 and the via-like exposed regions 17 to a portion of the top surface of the second insulating layer 50. The first surface S1 in the region E1 includes a part surface uncovered by first conductive region 60a, which is a region S3. In the embodiment, as the top view shows, the outline of the semiconductor stack 10 is a rectangular shape, and the region S3 is formed along a side of the rectangular shape. In another embodiment of the present application, the regions E1 and S3 can be formed on one or more corners of the rectangular shape. The second conductive region 60b of the conductive layer 60 is filled in the second group of second insulating openings 502 respectively to contact the reflective structure 16. In the embodiment, the second conductive region 60b contacts the barrier layer of the reflective structure 16 and covers another portion of the top surface of the second insulating layer 50. As a result, the first conductive region 60a electrically connects to the first semiconductor layer 101 and insulates from the second semiconductor layer 102 by the second insulating layer 50, and the second conductive region 60b electrically connects to the second semiconductor layer 102. The material of the conductive layer 60 includes a metal material, such as chromium (Cr), titanium (Ti), tungsten (W), gold (Au), aluminum (Al), indium (In), tin (Sn), nickel (Ni) or platinum (Pt), or an alloy or a stack of the above materials.

In an embodiment of the present application, from the top view, the area of the conductive layer 60 is larger than that of the active layer 103.

In an embodiment of the present application, when the light-emitting device 1 includes both the surrounding exposed region 15 and the one or more via-like exposed regions 17, an external current is injected into the light-emitting device 1 and conducted simultaneously to the first semiconductor layer 101 in the surrounding exposed region 15 and in the one or more via-like exposed regions 17 by the first conductive region 60a. The one or more via-like exposed regions 17 are dispersedly disposed and the surrounding exposed region 15 surrounds the via-like exposed regions 17 to distribute the light field of the light-emitting device 1 uniformly and reduce the forward voltage of the light-emitting device 1.

In an embodiment of the present application, when the light-emitting device 1 does not include the one or more via-like exposed regions 17, the first conductive region 60a can electrically connects to the first semiconductor layer 101 by means of contacting it in the surrounding exposed region 15. When an external current is injected into the light-emitting device 1, the current is conducted to the first semiconductor layer 101 in the surrounding exposed region 15 by the first conductive region 60a. That is, the injection region of the current surrounds the semiconductor stack 10 to distribute the light field uniformly and reduce the forward voltage of the light-emitting device 1.

Figure 7A:
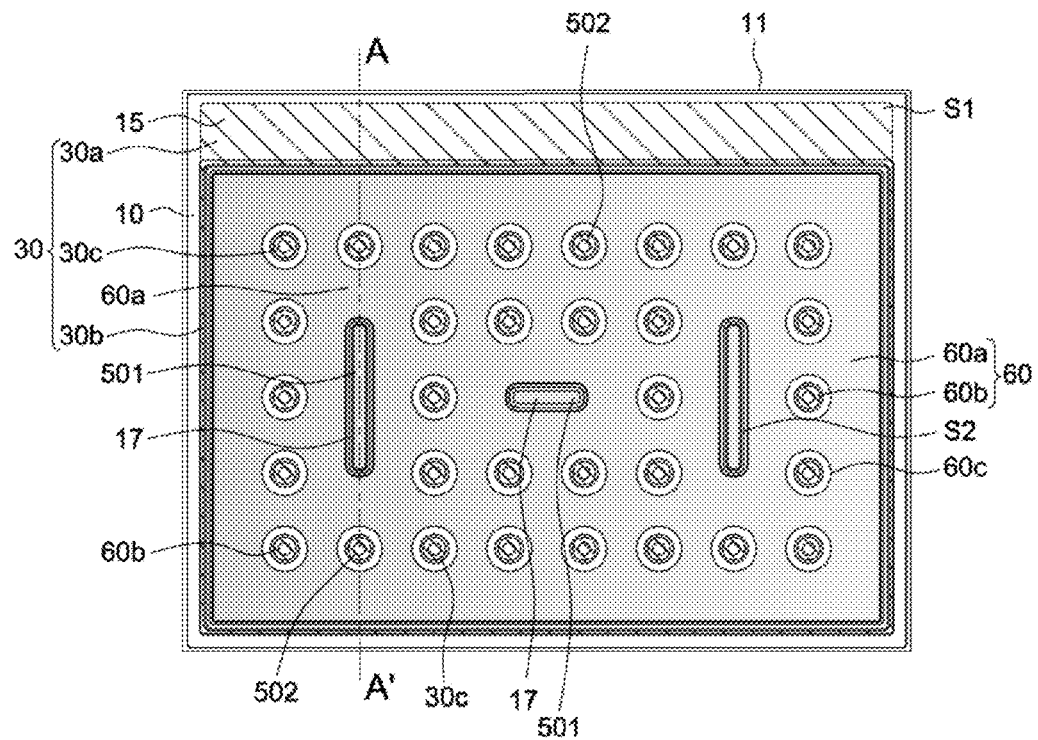
Figure 7B:
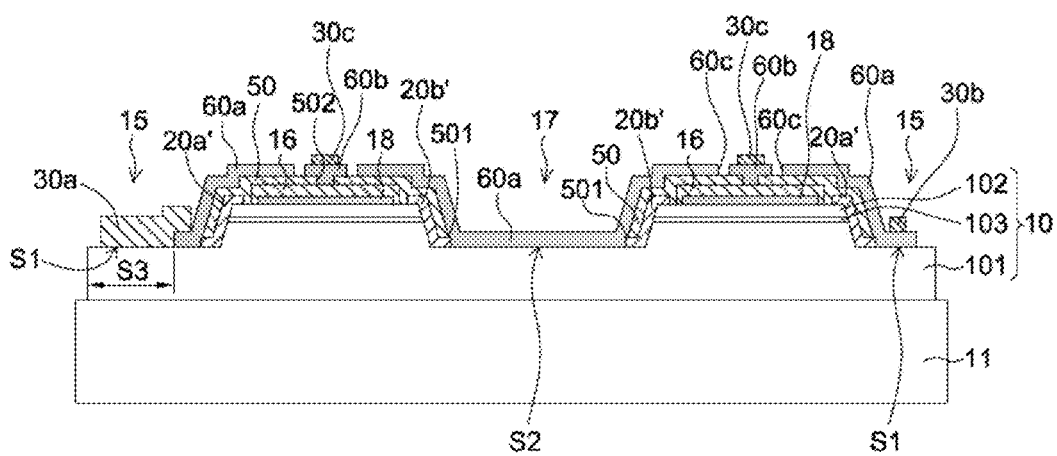

Following the step of forming the conductive layer 60, as a top view in FIG. 7A and a cross-sectional view in FIG. 7B which is taken along line A-A' of FIG. 7A show, the manufacturing method of the light-emitting device 1 includes a step of forming an electrode layer 30. The electrode layer 30 can be formed by depositing a conductive material layer on the first semiconductor layer 101 and the second semiconductor layer 102 by evaporation, deposition, etc., and then patterning it by lithography and etching. As FIG. 7 shows, the electrode layer 30 includes an electrode pad 30a, a ring-shaped electrode layer 30b extended from the electrode pad 30a and a connecting electrode layer 30c spatially separated from the electrode pad 30a and the ring-shaped electrode layer 30b. The electrode pad 30a and the ring-shaped electrode layer 30b are formed along the surrounding exposed region 15, whose shape substantially corresponds to the surrounding exposed region 15. To be more precisely, the ring-shaped electrode layer 30b is formed on the first conductive region 60a and contacts the first conductive region 60a. That is, from the top view, the ring-shaped electrode layer 30b contacts the periphery of the first conductive region 60a, and the electrode pad 30a is formed on the region S3 and contacts the first semiconductor layer 101 in the region S3. The electrode pad 30a is adjacent to a side of the semiconductor stack 10 and contacts and overlaps the edge of the first conductive region 60a. As a result, the electrode pad 30a and the ring-shaped electrode layer 30b electrically connect to the first semiconductor layer 101. In the embodiment, from the top view, the electrode pad 30a is a single rectangle and formed on a side of the growth substrate 11. The electrode pad 30a and the ring-shaped electrode layer 30b form a closed pattern which corresponds to the surrounding exposed region 15. The multiple connecting electrode layers 30c are formed on and correspond to each second conductive region 60b, and the area of the connecting electrode layer 30c is smaller than that of the second conductive region 60b, not beyond the second conductive region 60b. The material of the electrode layer 30 includes a metal material, such as chromium (Cr), titanium (Ti), tungsten (W), aluminum (Al), indium (In), tin (Sn), nickel (Ni) or platinum (Pt), or an alloy or a stack of the above materials.

In an embodiment of the present application, the electrode layer 30 can include one or more electrode pads 30a. The one or more pads 30a can be formed on one or more corners of the growth substrate 11.

In an embodiment of the present application, the electrode pads 30a, the ring-shaped electrode layer 30b and the connecting electrode layer 30c can be formed simultaneously, and the electrode pads 30a, the ring-shaped electrode layer 30b and the connecting electrode layer 30c can include the same material.

In an embodiment of the present application, the electrode pads 30a and the ring-shaped electrode layer 30b can be formed and followed by forming the connecting electrode layer 30c. Or the connecting electrode layer 30c can be formed and followed by forming the electrode pads 30a and the ring-shaped electrode layer 30b. The electrode pads 30a, the ring-shaped electrode layer 30b and the connecting electrode layer 30c can include different materials.

Figure 8A:
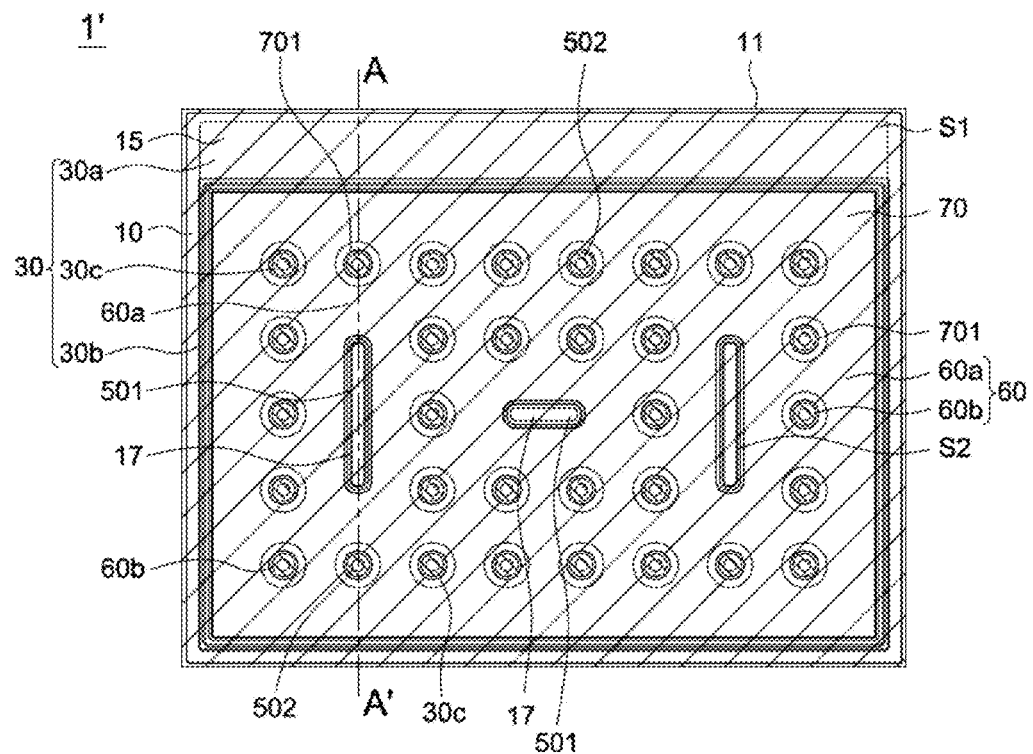
Figure 8B:
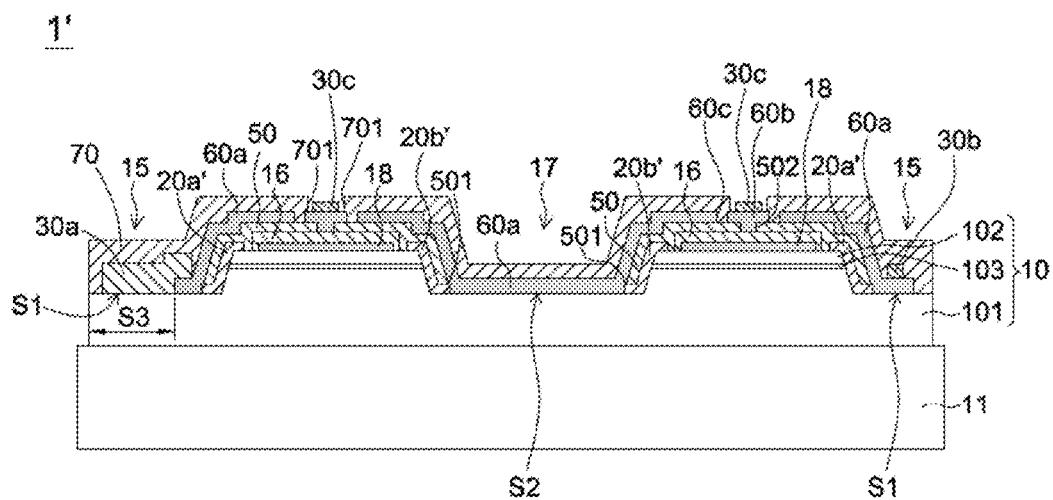

Following the step of forming the electrode layer 30, the manufacturing method of the light-emitting device 1 includes a step of forming a third insulating layer 70 as an outside insulating layer of the semiconductor stack 10. As a top view in FIG. 8A and a cross-sectional view in FIG. 8B which is taken along line A-A' of FIG. 8A show, a stack 1' is formed after the step of forming a third insulating layer 70. The third insulating layer 70 can be formed by depositing an insulating material layer on the semiconductor stack 10 and covering the electrode layer 30 and the conductive layer 60 by evaporation, deposition, etc., and then patterning it by lithography and etching to form a first group of third insulating openings 701 therein. The first group of third insulating openings 701 is formed on and corresponds to the second group of second insulating openings 502 and the second conductive region 60b to expose the connecting electrode layer 30c and the second conductive region 60b. The width of the first group of third insulating openings 701 is not larger than that of the conductive regions 60b, and not smaller than that of the connecting electrode layers 30c so that the connecting electrode layers 30c can be wholly exposed through the first group of third insulating openings 701. As the second insulating layer 50, the third insulating layer 70 can include only single layer. When multiple third insulating layers 70 are formed the semiconductor stack 10, the third insulating layers 70 include two or more layers having different refractive index materials alternately stacked to form a Distributed Bragg reflector (DBR), which can selectively reflect light with a specific wavelength.

In an embodiment of the present application, the electrode layer 30 does not include the connecting electrode layer 30c. When the electrode layer 30 does not include the connecting electrode layer 30c, the first group of third insulating openings 701 exposes each conductive region 60b.

Figure 9A:
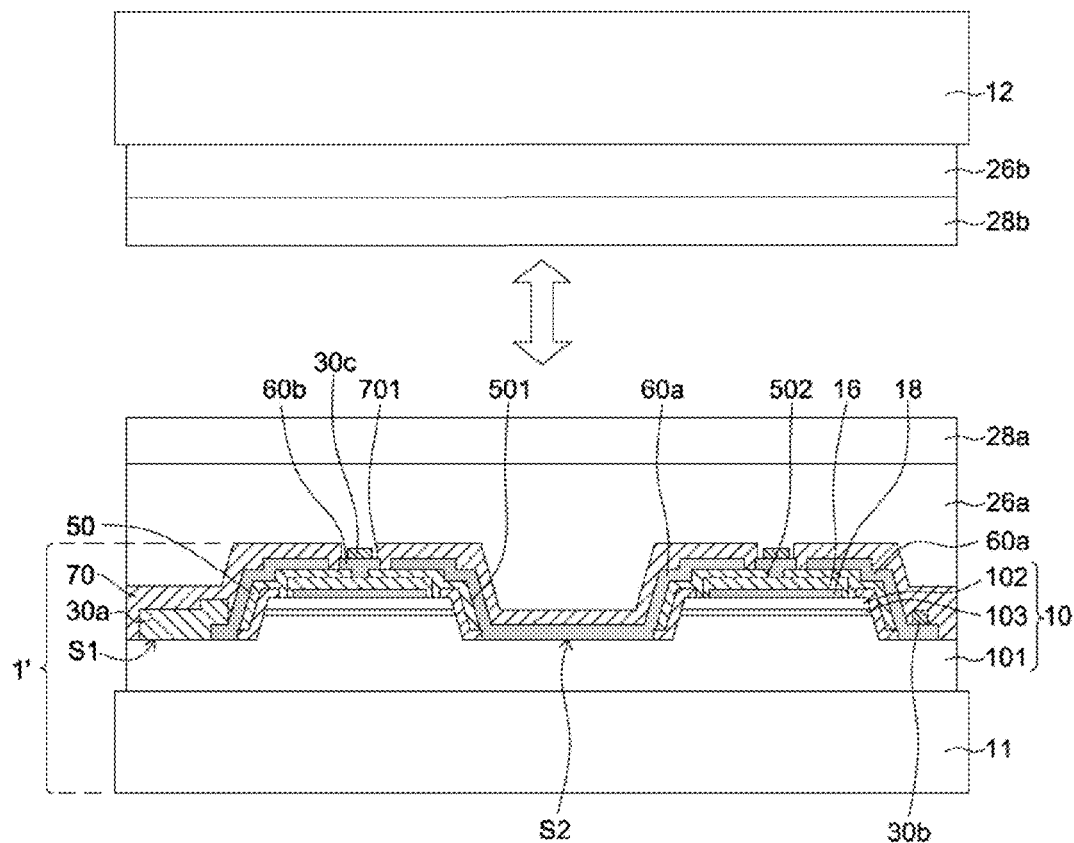
Figure 9B:
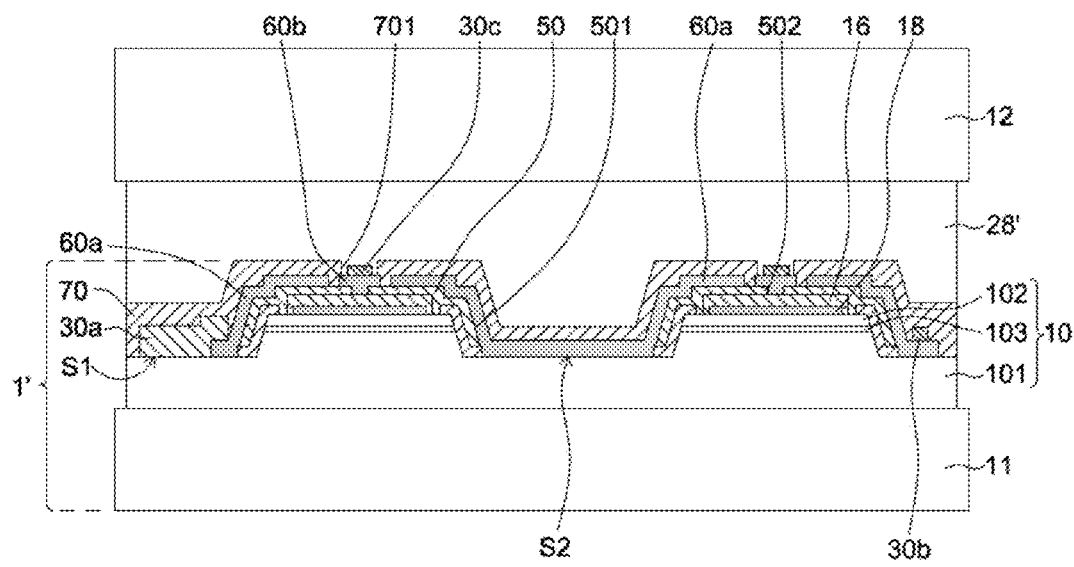

Following the step of forming the third insulating layer 70, as a cross-sectional views in FIGS. 9A and 9B show, the manufacturing method of the light-emitting device 1 includes a bonding step, which includes forming a first metal layer 26a on the third insulating layer 70, forming a first bonding layer 28a on the first metal layer 26a, providing a conductive substrate 12 with a second metal layer 26b and a second bonding layer 28b formed thereon sequentially, and connecting the first bonding layer 28a and the second bonding layer 28b at heating temperature higher than the room temperature. In the embodiment, the heating temperature is below 200° C. The material of the conductive substrate 12 can include a semiconductor material, such as silicon (Si) or a metal material, such as copper (Cu), molybdenum (Mo), tungsten (W) or an alloy or a composite of the above materials. The material of the first metal layer 26a can include a metal material with higher melting point, such as nickel (Ni), titanium (Ti), copper (Cu), gold (Au), platinum (Pt), or rhodium (Rh). The material of the second metal layer 26b can include a metal material with lower melting point, such as cadmium (Cd), tin (Sn), or indium (In). In an embodiment of the present application, the metal material with lower melting point is the metal material with melting point below 200° C., such as indium (In). The metal material with higher melting point is the metal material with melting point above 200° C., such as titanium (Ti) or gold (Au). In the bonding method, the upside of the stack 1' can be turned down and aligning and bonding the conductive substrate 12, or the upside of the conductive substrate 12 can be turned down and aligning and bonding the stack 1'. When the bonding step is finished, as FIG. 9B shows, the first metal layer 26a, the first bonding layer 28a, the second metal layer 26b, and the second bonding layer 28b form a bonding structure 28'. The bonding structure 28' fills in the first group of third insulating openings 701, and contacts the connecting electrode layer 30c and the second conductive region 60b. As a result, the conductive substrate 12 electrically connects to the second conductive region 60b and the second semiconductor layer 102 through the first group of third insulating openings 701.

In an embodiment of the present application, the conductive substrate 12 can be a wafer-scale substrate or a chip-scale substrate. The substrate mentioned herein can be, but not limited to, circular shape, polygonal shape or irregular shape. The substrate mentioned herein can be divided into multiple chip-scale light-emitting devices during the subsequent process, or can directly form a light-emitting device without going through the separation process.

When the first metal layer 26a and the first bonding layer 28a are formed, the connecting electrode layer 30c can reduce the gap caused by the thickness of the insulating layer 70 in the first group of third insulating openings 701 to improve the yield of the bonding process. In an embodiment of the present application, the electrode layer 30 does not include the connecting electrode layer 30c, and the first metal layer 26a fills in the first group of third insulating openings 701 to contact the second conductive region 60b. When the bonding step is performed, the conductive substrate 12 can electrically connect to the second conductive region 60b and the second semiconductor layer 102.

Figure 18:
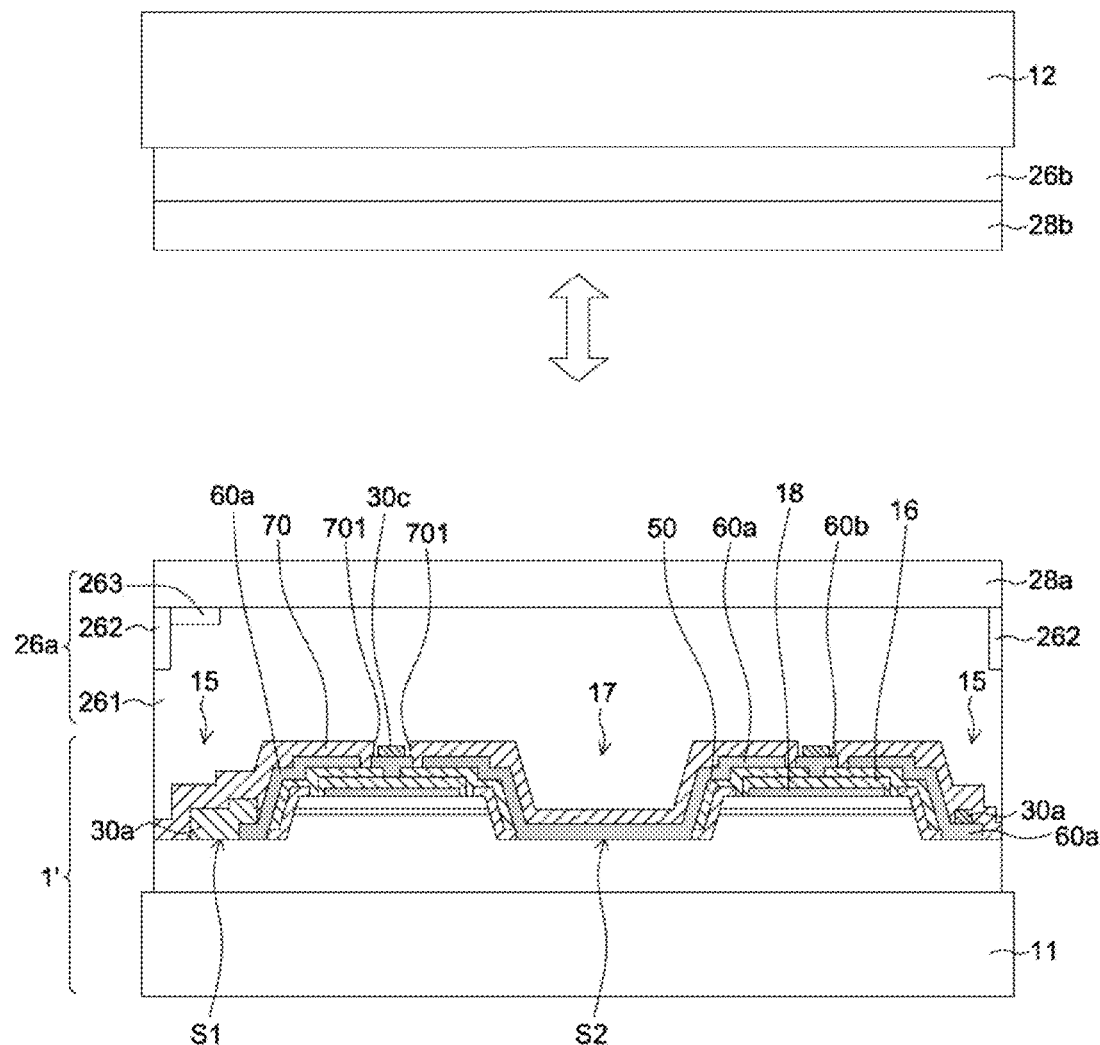
FIG. 18 illustrates a manufacturing method of a light-emitting device 1 in accordance with another embodiment of the present application.

In an embodiment of the present application, the formation of the first metal layer 26a can be accomplished by forming metal materials in sequence on different regions of the stack 1'. For example, as FIG. 18 shows, when the thickness differences between the layers of the stack 1' are too large, there tends to be gap issue in the first metal layer 26a, especially on the peripheries of the surrounding exposed region 15 and the region adjacent to the electrode pad 30a. Therefore, a thick metal material 261 can be formed over the third insulating layer 70, and then the metal materials 262 and 263 are formed in sequence on the region where the gap of the thick metal material 261 is large enough to form a relatively flat first metal layer 26a and improve the yield of the bonding process. The materials formed in sequence can be the same or different.

Following the bonding step, as a cross-sectional view in FIG. 10A shows, the manufacturing method of the light-emitting device 1 includes a step of removing the growth substrate 11. In the embodiment, after turning the upside of the stack 1' down and connecting the conductive substrate 12, the growth substrate 11 can be removed to expose the surface 10s of the semiconductor stack 10 by Laser Lift-Off process which provides a laser (not shown in the figures) from the rear side of the growth substrate 11, i.e. the surface of the growth substrate 11 away from the conductive substrate 12.

In an embodiment of the present application, following the step of removing the growth substrate 11, the manufacturing method of the light-emitting device 1 includes a roughening step. As a cross-sectional view in FIG. 10B shows, the surface 10s of the semiconductor stack 10 is etched by an etchant to form a rough structure TS thereon for increasing the light-emitting efficiency of the light-emitting device 1. The rough structure TS can be a regularly or an irregularly rough surface. The etchant can include an alkaline solution such as potassium hydroxide (KOH) or sodium hydroxide (NaOH).

In an embodiment of the present application, after removing the growth substrate 11, the buffer layer (not shown in the figures) remaining on the surface 10s can be further removed by dry etching, wet etching or both, and followed by the roughening step.

In an embodiment of the present application, the rough structure TS can be formed by adjusting the etching process conditions while removing the buffer layer (not shown in the figures) remaining on the surface 10s.

Following the roughening step, the manufacturing method of the light-emitting device 1 includes a step of forming a wire-bonding pad 36. First, as a cross-sectional view in FIG. 11A shows, a portion of the first semiconductor layer 101 on the electrode pad 30a can be removed from the surface 10s of the semiconductor stack 10 or the roughened structure TS by dry etching and/or wet etching before or after the roughening step so that the electrode pad 30a is exposed. The exposed region can be regarded as a non-closed opening 38, which is shaped, from the top view, to be substantially corresponding to the electrode pad 30a. Before the non-closed opening 38 is formed, the first surface S1 of the surrounding exposed region 15 includes a width W1 which is larger than the width W2 of the non-closed opening 38. After the surrounding exposed region 15 and the non-closed opening 38 are formed successively, the electrode pad 30a connects a side of the first surface S1, formed in the surrounding exposed region 15 and corresponds to the non-closed opening 38. The electrode pad 30a has a width W3 larger than the width W2. From the top view, the electrode pad 30a is formed on a side of the light-emitting device 1. The electrode pads 30a can be formed on one or more corners of the light-emitting device 1 when the electrode layer 30 includes one or more electrode pads 30a. The top surface 301 of the electrode pad 30a includes a contact region 301a connecting the first surface S1 of the first semiconductor layer 101. In an embodiment, the contact region 301a connects the first surface S1 of the first semiconductor layer 101 through the first conductive region 60a. In another embodiment, the contact region 301a can further include, in addition to connecting the first surface S1 through the first conductive region 60a, a region directly connecting the first surface S1 of the first semiconductor layer 101. The top surface 301 of the electrode pad 30a further includes an exposed region 301b exposed by the non-closed opening 38, which does not overlap with the semiconductor stack 10. The thickness of the first semiconductor layer 101 can be 3~4 μm and be divided into a first portion 101a and a second portion 101b. The thickness of the first portion 101a is substantially equal to the depth of the non-closed opening 38, which is about 1.5 to 3 μm. The thickness of the second portion 101b corresponding to the surrounding exposed region 15 is about 1 to 1.5 μm. The electrode pad 30a can be electrically connected to the first semiconductor layer 101 but not formed on the light-emitting surface so as to not shield the light of the light-emitting device 1.

In an embodiment of the present application, the other portion of the first semiconductor layer 101 can be further etched and removed, while the portion of the first semiconductor layer 101 on the electrode pad 30a is removed to form the non-closed opening 38, to expose a portion of the third insulating layer 70 as a scribing line for the subsequent scribing step. The position and size of each light-emitting device 1 are defined by a plurality of scribing lines.

Next, as FIG. 11B shows, the wire-bonding pad 36 is formed on the exposed region 301b. A gap is formed between the wire-bonding pad 36 and the adjacent semiconductor stack 10, so the wire-bonding pad 36 does not directly contact the semiconductor stack 10. From the top view, the shape of the wire-bonding pad 36 is substantially similar to that of the electrode pad 30a and the width and the area of the wire-bonding pad 36 is smaller than that of the electrode pad 30a. In the subsequent wire bonding process, a solder ball (not shown in the figures) can be formed on the wire-bonding pad 36 to connect the light-emitting device 1 to the external power supply or other electronic components.

Following the step of forming the wire-bonding pad 36, as a cross-sectional view in FIG. 11B shows, the manufacturing method of the light-emitting device 1 includes a step of forming a passivation layer 80. The passivation layer 80 can be formed by depositing an insulating material layer on the light-emitting device 1 by evaporation, deposition, etc., and then be patterned by lithography and etching to form an opening 801 and expose the wire-bonding pad 36. The passivation layer 80 covers the surface and sidewall of the semiconductor stack 10 and covers the gap between the wire-bonding pad 36 and the semiconductor stack 10 to protect the light-emitting device 1 from the adverse effects due to the temperature, humidity and static electricity of the external environment. In an embodiment of the present application, the conductive substrate 12 and the semiconductor stack 10 are wafer scale. After the step of forming a passivation layer 80, the wafer-scale conductive substrate 12 can be scribed. The scribing step includes cutting the passivation layer 80, the conductive substrate 12 and the bonding structure 28' through the scribing lines to form a plurality of light-emitting devices 1. The scribing lines are formed by etching the first semiconductor layer 101 in the step of forming the non-closed opening 38 mentioned above. The cutting process includes blade cutting or laser cutting.

Figure 12:
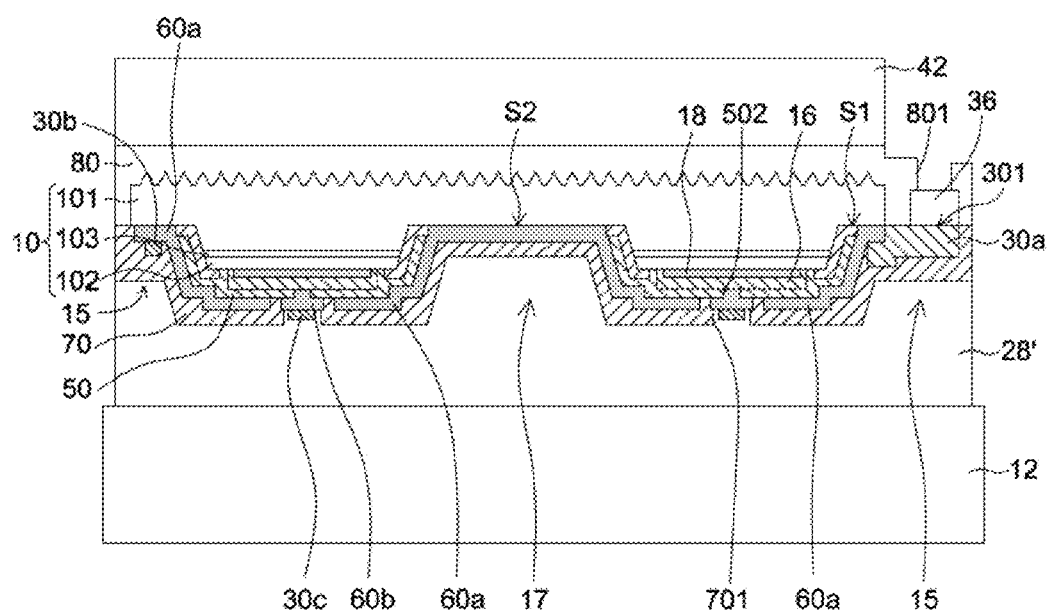

FIG. 12 is a cross-sectional view of a light-emitting device 1a according to an embodiment of the present application. The difference between the light-emitting device 1a and the light-emitting device 1 is a wavelength conversion layer 42 formed optionally on the passivation layer 80 after the step of forming a passivation layer 80. The wavelength conversion layer 42 can be a phosphor layer or a quantum dot material. The wavelength of the light emitted from the semiconductor stack 10 can be converted to a light with different wavelength converted by the wavelength conversion layer 42. The step of forming the wavelength conversion layer 42 is performed prior to the scribing step.

The light-emitting device 1, as shown in FIG. 11B, is formed by the manufacturing method of the embodiment. When an external current is injected into the light-emitting device 1 through the wire-bonding pad 36 and the conductive substrate 12, the current is first conducted to the electrode pad 30a and the ring-shaped electrode layer 30b, and then spread by the first conductive region 60a and conducted to the first semiconductor layer 101 in the surrounding exposed region 15 and the via-like exposed region 17. As a result, the current can be uniformly spread in the first semiconductor layer 101 to distribute the light field uniformly and reduce the forward voltage of the light-emitting device 1. Furthermore, the third insulating layer 70 can isolate the electrode pad 30a and the ring-shaped electrode layer 30b from the second semiconductor layer 102 and the active layer 103. The electrode pad 30a, the ring-shaped electrode layer 30b and the active layer 103 are located in different regions of the light-emitting device 1 in a horizontal direction. As shown in FIG. 11B, the semiconductor stack 10 is turned over and disposed on the conductive substrate 12, and thus the whole active layer 103 is located on the reflective structure 16 and the second conductive region 60b. The wire-bonding pad 36 is formed in the non-closed opening 38 and corresponds to the electrode pad 30a. In the light-emitting device 1, there is no electrode structure formed on the light-emitting surface corresponding to the active layer 103. Therefore, the light emitted from the active layer 103 is not shielded by the electrode structure of the light-emitting device 1 to enhance the light-emitting efficiency.

Figure 16A:
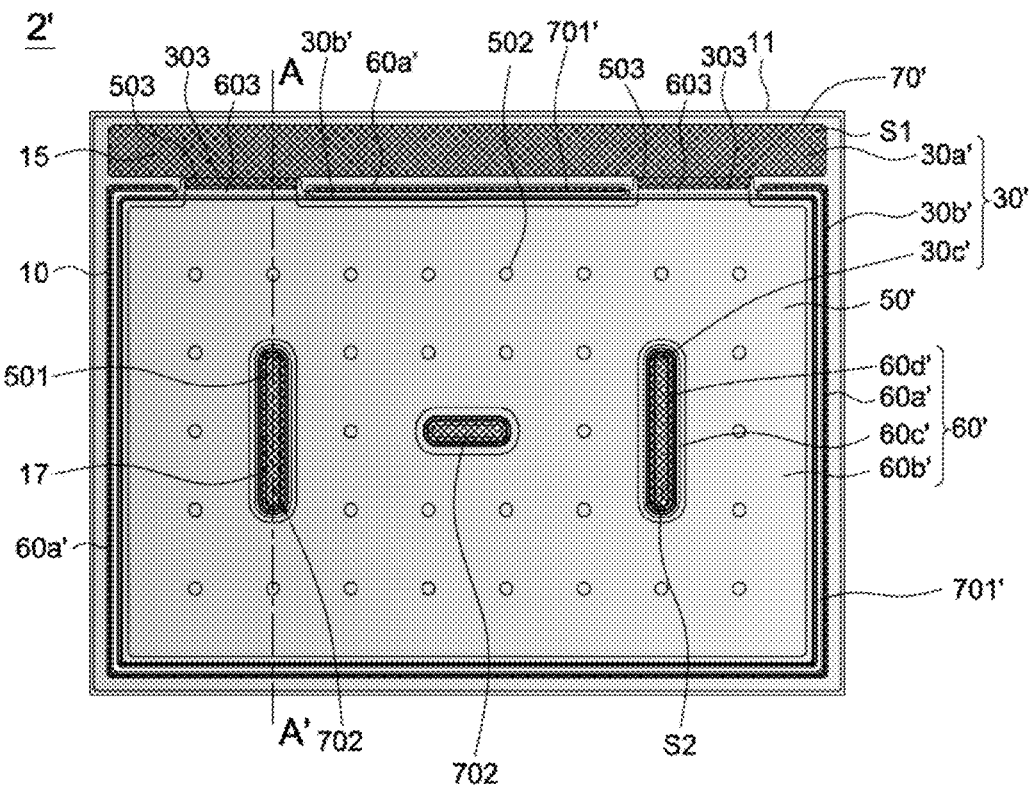
Figure 16B:
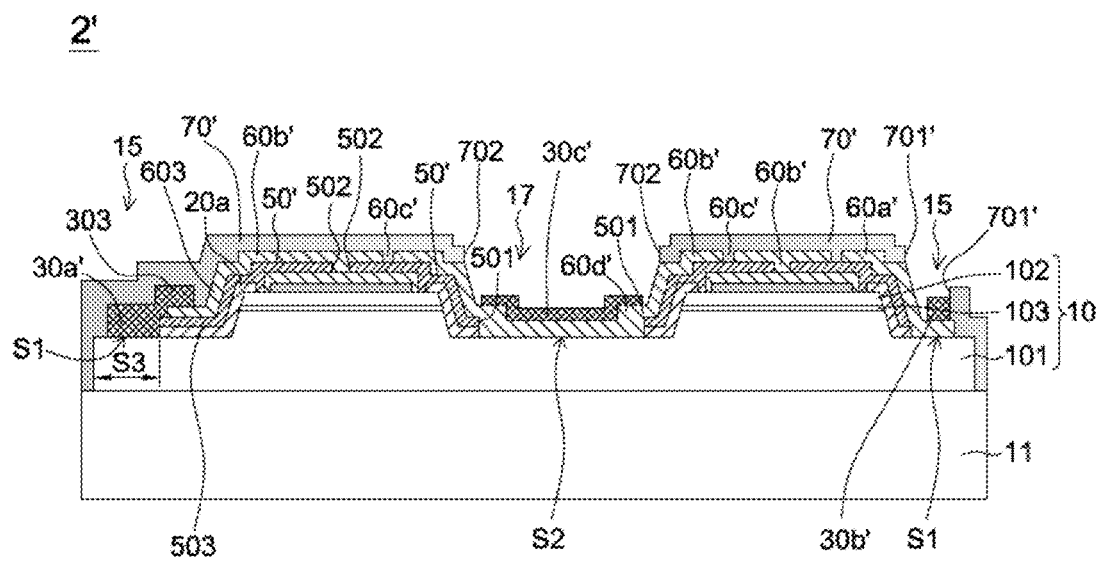
Figure 17A:
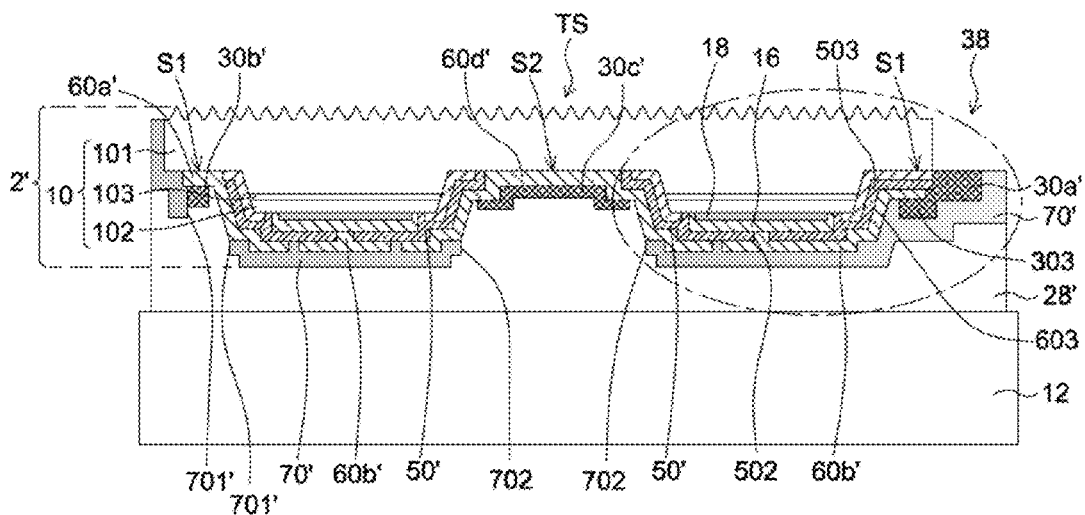
Figure 17A:
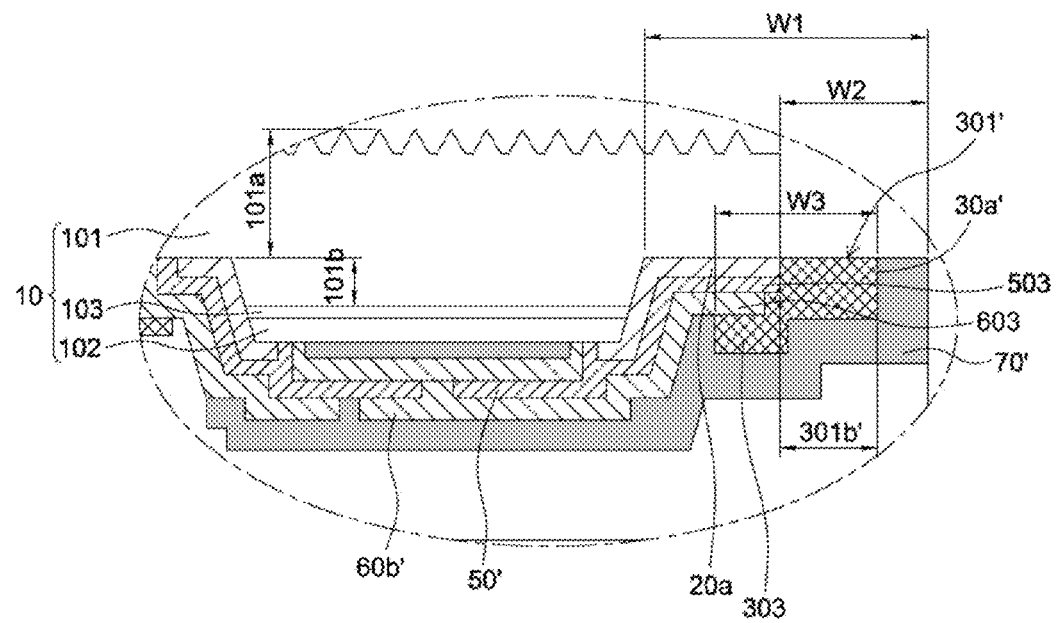
Figure 17B:
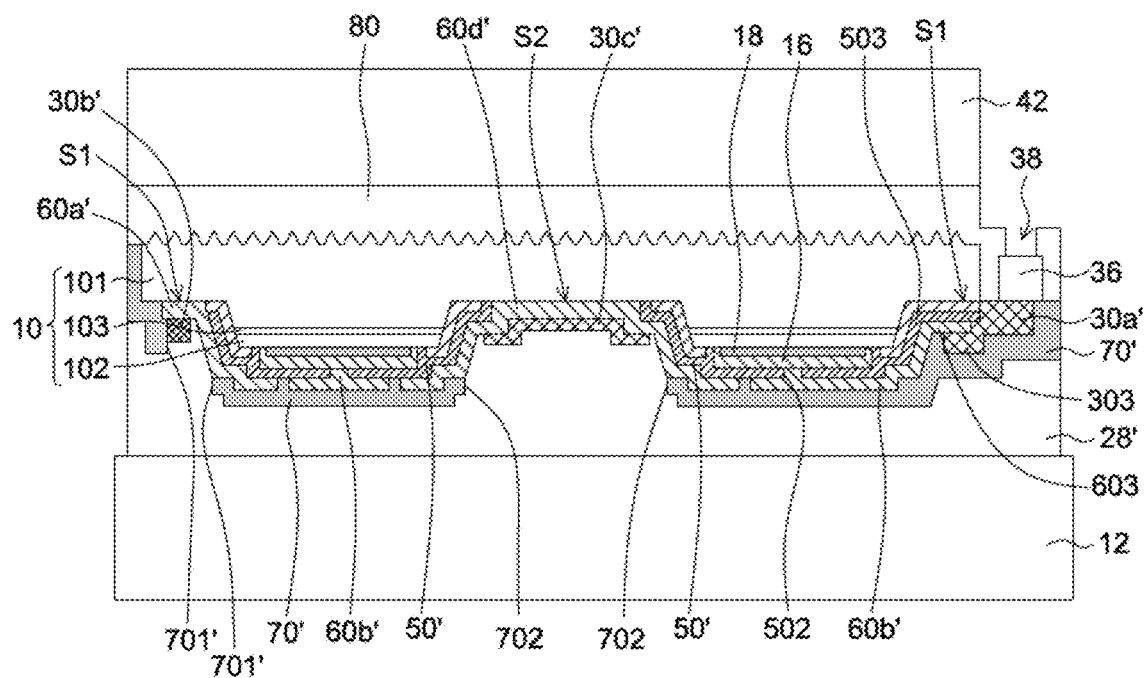

FIG. 17B illustrates a light-emitting device 2 in accordance with an embodiment of the present application. FIGS. 13A to 17B illustrate a manufacturing method of a light-emitting device 2 in accordance with embodiments disclosed in the present application.

The manufacturing method of the light-emitting device 2 includes the step of forming the mesa, the step of the first insulating layer 20, the step of forming the current spreading layer 18, and the step of forming the reflective structure 16. The above step and structure of each layer are the same as those described in the manufacturing method of the light-emitting device 1, and thus are not described again.

Figure 13A:
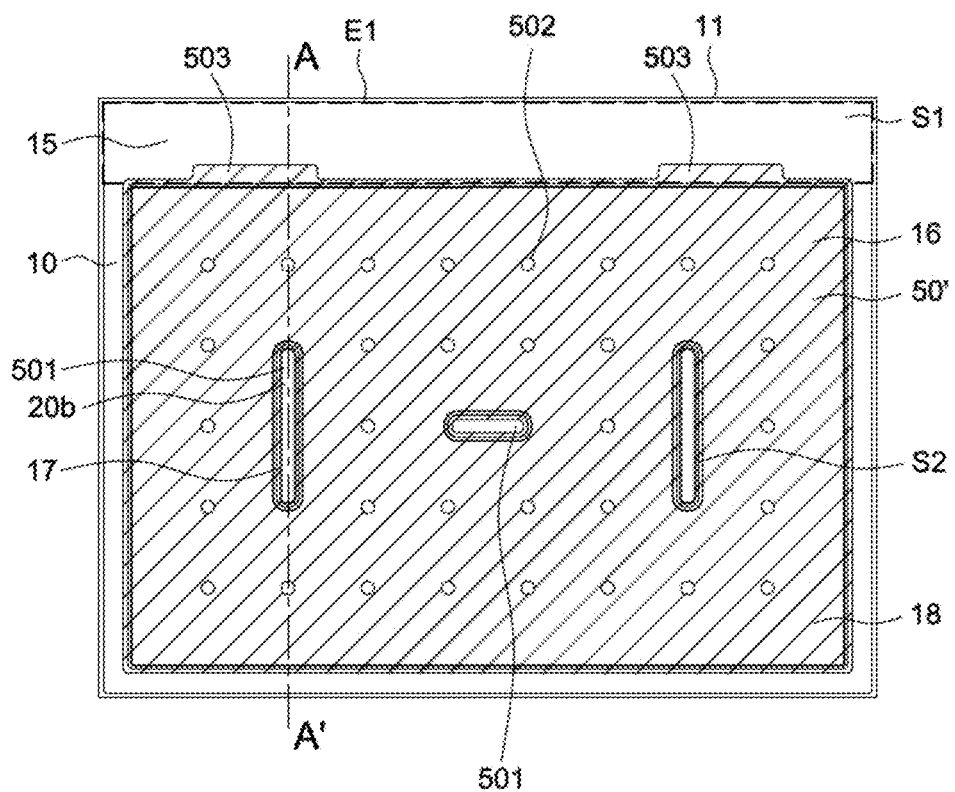
FIGS. 13A, 13B, 14A, 14B, 15A, 15B, 16A, 16B, 17A, and 17B illustrate a manufacturing method of a light-emitting device 2 in accordance with an embodiment of the present application.
Figure 13B:
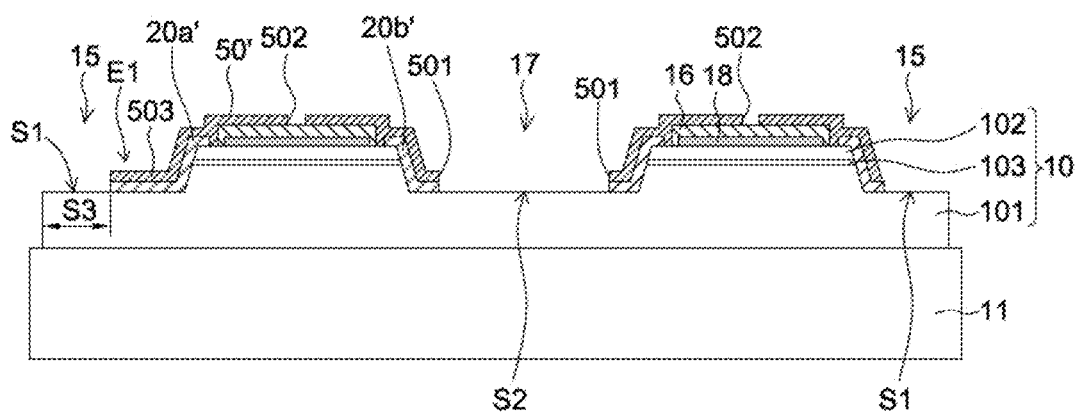

Following the step of forming the reflective structure 16, as a top view in FIG. 13A and a cross-sectional view in FIG. 13B which is taken along line A-A' of FIG. 13A show, the manufacturing method of the light-emitting device 2 includes a step of forming a second insulating layer 50'. The step of forming the second insulating layer 50' is similar to the mentioned manufacturing method of the light-emitting device 1 and the difference is that the second insulating layer 50' further includes a second insulating protrusion portion 503 extending to the region E1 and formed on the first surface S1 of the surrounding exposed region 15. The area of the second insulating layer 50', with the two second insulating protrusion portions 503, covering the first surface S1 of the surrounding exposed region 15 is larger than that of the rectangular second insulating layer 50, without the insulating protrusion portion, covering the first surface S1 of the surrounding exposed region 15. The region E1 of the surrounding exposed region 15 includes a wider width wherein the first surface S1 thereof includes a region S3 whose surface is not covered by the first insulating layer 20 and the second insulating layer 50'. In the embodiment, the semiconductor stack 10 is rectangular and the region S3 is formed along a side of the rectangle. In another embodiment, the region S3 can be formed on one or more corners of the rectangle.

As described in the manufacturing method of the light-emitting device 1, during the process for patterning the second insulating layer 50', the first insulating surrounding region 20a covering the surrounding exposed region 15 and the first insulating covering region 20b formed in the via-like exposed region 17 are partially etched and removed to expose the first surface S1 and the second surface S2 of the first semiconductor layer 101 and form a first group of second insulating openings 501, a first insulating surrounding region 20a' and a first insulating covering regions 20b'. As FIG. 13B shows, the first insulating surrounding region 20a' under the second insulating protrusion portion 503 is retained.

Figure 14A:
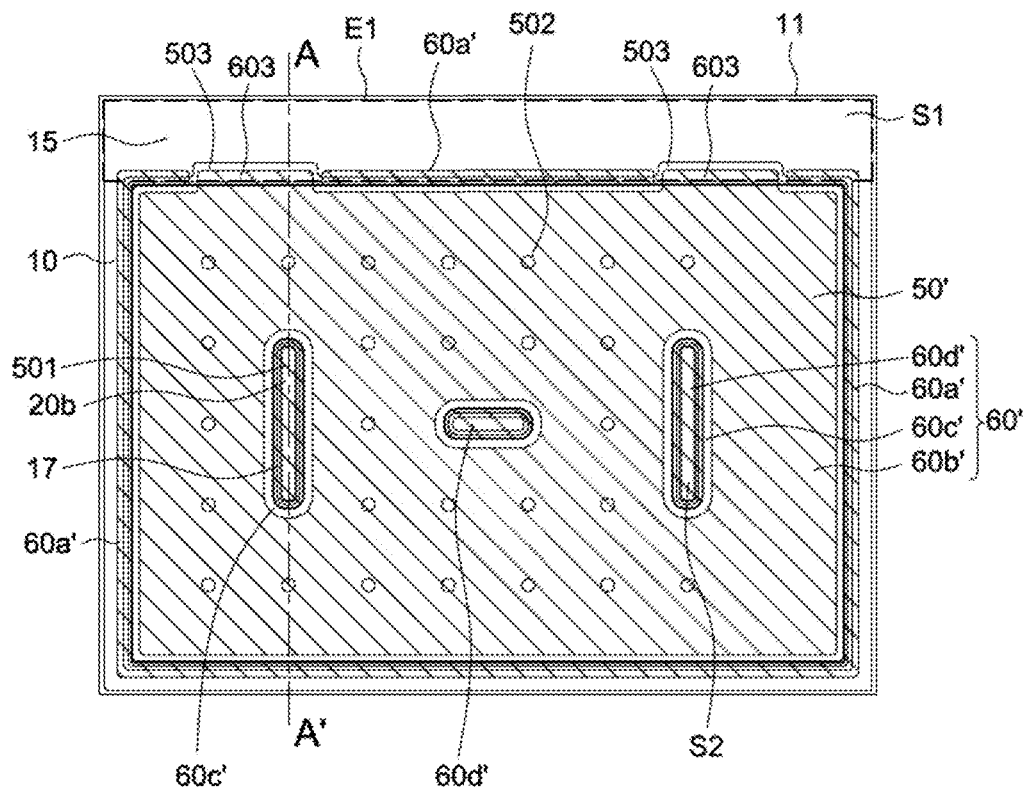
Figure 14B:
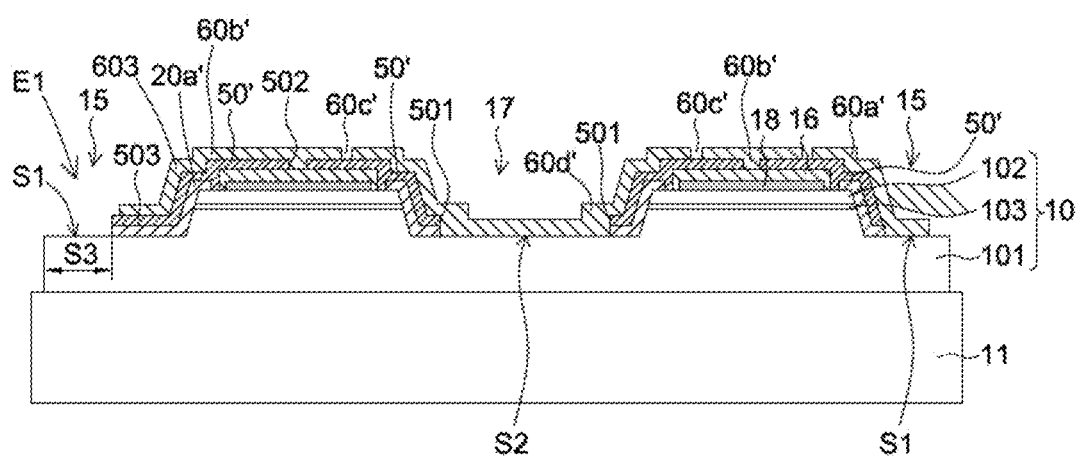

Following the step of forming the second insulating layer 50', as a top view in FIG. 14A and a cross-sectional view in FIG. 14B which is taken along line A-A' of FIG. 14A show, the manufacturing method of the light-emitting device 2 includes a step of forming a conductive layer 60'. The step of forming the conductive layer 60' is similar to the mentioned manufacturing method of the light-emitting device 1 and the difference is that, as FIG. 14A shows, the conductive layer 60' includes a first conductive region 60a', a second conductive region 60b' and a third conductive region 60d' spatially separated from each other by a slit 60c'. In the embodiment, the pattern of the first conductive region 60a' is a discontinuous and ring-shaped stripe, which includes a U-shaped stripe pattern surrounding the three sides of the semiconductor stack 10 and a straight stripe pattern adjacent to the region E1 of the surrounding exposed region 15. The first conductive region 60a' contacts the first semiconductor layer 101 (i.e. the first surface S1) in the surrounding exposed region 15, electrically connects to the first semiconductor layer 101, covers the peripheries of the second insulating layer 50' and isolated from the semiconductor layer 102. The second conductive region 60b' is formed on the semiconductor layer 102, covers the top surface of a portion of the second insulating layer 50' and filled in the second group of second insulating openings 502 to contact the reflective structure 16 and electrically connect to the second semiconductor layer 102. As FIG. 14A shows, the second conductive region 60b' includes a second conductive protrusion portion 603 corresponding to the second insulating protrusion portion 503. The second conductive protrusion portion 603 extends from the second conductive region 60b' and covers and contacts the second insulating protrusion portion 503. As a result, the second insulating protrusion portion 503 is between the second conductive protrusion portion 603 and the first surface S1, and thus the second conductive protrusion portion 603 is isolated from the semiconductor layer 101. From the top view, the edge of the second conductive region 60b' does not exceed beyond the second semiconductor layer 102, except for the region in the second conductive protrusion portion 603. In the embodiment, the two second conductive protrusion portions 603 are formed on the discontinuous regions of the first conductive region 60a', i.e. between the U-shaped stripe pattern and the straight stripe pattern of the first conductive region 60a'. The third conductive region 60d' corresponds to the via-like exposed region 17, contacts the second surface S2 of the first semiconductor layer 101 through the first group of second insulating openings 501 to electrically connect to the first semiconductor 101, and covers the second insulating layer 50' near the via-like exposed region 17. The material of the conductive layer 60' is the same as that of the conductive layer 60 of the light-emitting device 1, and therefore is not described again.

In an embodiment of the present application, from the top view, the area of the conductive layer 60' is larger than that of all active regions 103.

In an embodiment of the present application, the light-emitting device 2 includes a structural arrangement with the via-like exposed regions 17 dispersedly disposed and the surrounding exposed region 15 surrounding the via-like exposed regions 17. When an external current is injected into the light-emitting device 2, the current can be conducted to the first semiconductor layer 101 in the surrounding exposed region 15 and in the via-like exposed regions 17 by the first conductive region 60a' to form a plurality of current injection regions, which can uniformly spread the injected current and then reduce the forward voltage so the light field of the light-emitting device 2 can distribute uniformly.

In an embodiment of the present application, the first conductive region 60a' can still electrically connect to the first semiconductor layer 101 in the surrounding exposed region 15 by contacting the first semiconductor layer 101 while the semiconductor stack 10 does not include one or more via-like exposed regions 17. When an external current is injected into the light-emitting device 2, the current is conducted to the first semiconductor layer 101 in the surrounding exposed region 15 through the first conductive region 60a'. That is, the current injection region corresponds substantially to surrounding the semiconductor stack 10, which can uniformly distribute the light field and reduce the forward voltage of the light-emitting device 2.

Figure 15A:
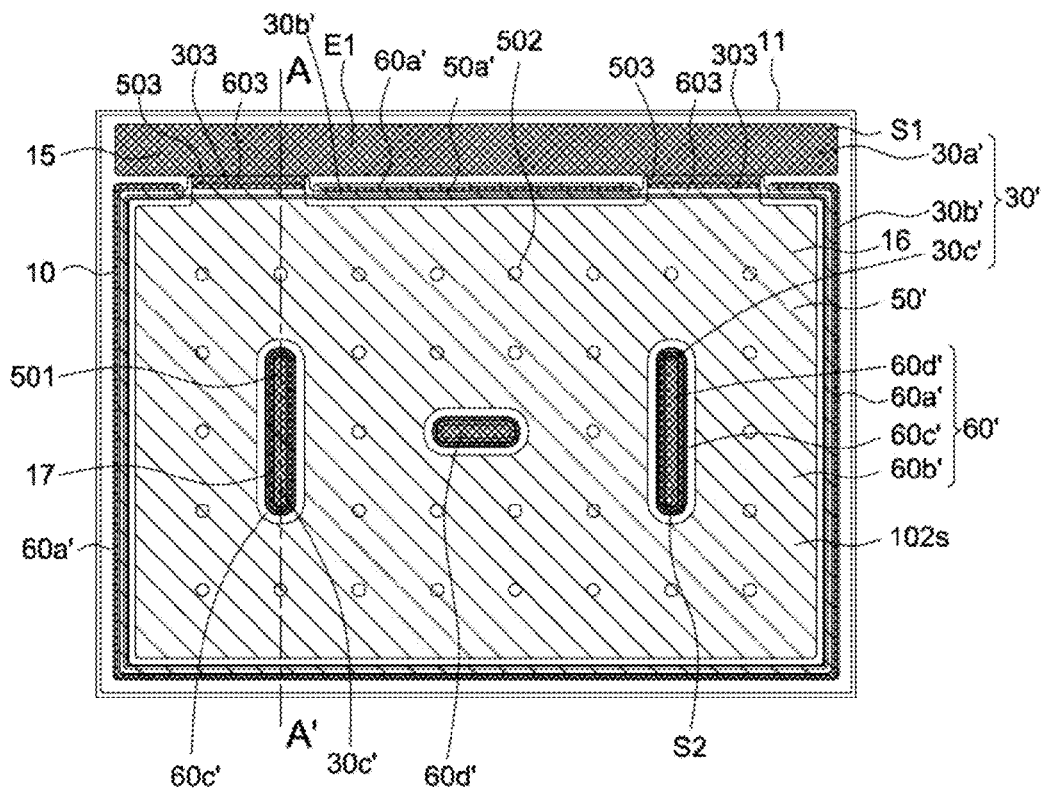
Figure 15B:
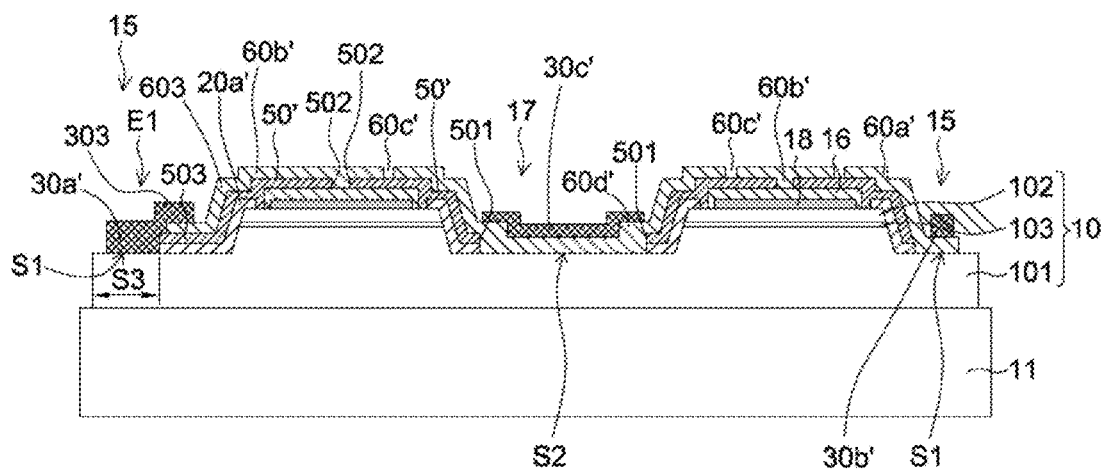

Following the step of forming the conductive layer 60', as a top view in FIG. 15A and a cross-sectional view in FIG. 15B which is taken along line A-A' of FIG. 15A show, the manufacturing method of the light-emitting device 2 includes a step of forming an electrode layer 30'. The step of forming the electrode layer 30' is similar to the mentioned manufacturing method of the light-emitting device 1 and the difference is that, as FIG. 15A shows, the electrode layer 30' includes an electrode pad 30a', a ring-shaped electrode layer 30b', and a connecting electrode layer 30c' spatially separated from one another. The ring-shaped electrode layer 30b' is formed along the surrounding exposed region 15 and on the first conductive region 60a' in the surrounding exposed region 15, and contacts the first conductive region 60a. That is, from the top view, the pattern of the ring-shaped electrode layer 30b' is a discontinuous and ring-shaped stripe as that of the first conductive region 60a', which includes a U-shaped stripe pattern surrounding the three sides of the semiconductor stack 10 and a straight stripe pattern adjacent to the region E1 of the surrounding exposed region 15. The line width of the ring-shaped electrode layer 30b' is smaller than that of the first conductive region 60a'. The electrode pad 30a' is formed on the region S3 and contacts the first semiconductor layer 101 in the region S3. The side of the electrode pad 30a' adjacent to the first semiconductor layer 101 includes an electrode pad protrusion portion 303 which protrudes opposed to the protruding direction of the second conductive protrusion portion 603 and overlaps and contacts the second conductive protrusion portion 603. In the embodiment, from the top view, the electrode pad 30a' is formed on the region E1 adjacent to the surrounding exposed region 15. The multiple connecting electrode layers 30c' are formed on and correspond to each second conductive region 60d', and the area of the connecting electrode layer 30c' is smaller than that of the second conductive region 60d', not beyond the second conductive region 60d'. The material of the electrode layer 30' includes a metal material, such as chromium (Cr), titanium (Ti), tungsten (W), aluminum (Al), indium (In), tin (Sn), nickel (Ni) or platinum (Pt), or an alloy or a stack of the above materials.

In an embodiment of the present application, the electrode layer 30' can include one or more electrode pads 30a'. The one or more electrode pads 30a' can be formed on one or more corners of the growth substrate 11.

In an embodiment of the present application, the electrode pads 30a', the ring-shaped electrode layer 30b' and the connecting electrode layer 30c' can be formed simultaneously. The electrode pads 30a', the ring-shaped electrode layer 30b', and the connecting electrode layer 30c' can include the same material.

In an embodiment of the present application, the electrode pads 30a' and the ring-shaped electrode layer 30b' can be formed and followed by forming the connecting electrode layer 30c'. Or the connecting electrode layer 30c' can be formed and followed by forming the electrode pads 30a' and the ring-shaped electrode layer 30b'. The electrode pads 30a', the ring-shaped electrode layer 30b' and the connecting electrode layer 30c' can include different materials.

Following the step of forming the electrode layer 30', the manufacturing method of the light-emitting device 2 includes a step of forming a third insulating layer 70'. As a top view in FIG. 16A and a cross-sectional view in FIG. 16B which is taken along line A-A' of FIG. 16A shows, a stack 2' is formed after the step of forming a third insulating layer 70'. The step of forming the third insulating layer 70' is similar to the mentioned manufacturing method of the light-emitting device 1 and the difference is that, as FIG. 16A shows, the third insulating layer 70' includes a first group of third insulating openings 701' and a second group of third insulating openings 702 separated from each other. The first group of third insulating openings 701' is formed on and corresponds to the first conductive region 60a'. In the embodiment, from the top view, the pattern of the first group of third insulating openings 701' is a discontinuous and ring-shaped stripe as that of the first conductive region 60a', and the opening width of the first group of third insulating openings 701' can be smaller than the width of the first conductive region 60a' to expose a portion of the first conductive region 60a' and the ring-shaped electrode layer 30b'. In another embodiment of the present application, the first group of third insulating openings 701' can be formed on and corresponds to the ring-shaped electrode layer 30b' to expose the ring-shaped electrode layer 30b'. In another embodiment of the present application, the first group of third insulating openings 701' exposes the first conductive region 60a'. The second group of third insulating openings 702 is formed on and corresponds to the via-like exposed region 17 to expose a portion of the third conductive region 60d' and the connecting electrode layer 30c'.

In an embodiment of the present application, the electrode layer 30' does not include the connecting electrode layer 30c'. When the electrode layer 30' does not include the connecting electrode layer 30c', the second group of third insulating openings 702 exposes third conductive region 60d'.

Following the step of forming the third insulating layer 70', the manufacturing method of the light-emitting device 2 includes a bonding step, a step for removing the growth substrate 11 and a roughening step. The above steps and bonding structures are the same as those described in the manufacturing method of the light-emitting device 1, and thus are not described again. In an embodiment of the present application, the conductive substrate 12 can be a wafer-scale substrate or a chip-scale substrate. The substrate mentioned herein can be, but not limited to, circular shape, polygonal shape or irregular shape. The substrate mentioned herein can be divided for forming multiple chip-scale light-emitting devices during the subsequent process, or can directly for forming a light-emitting device without going through the separation process. After the above steps are performed, as FIG. 17A shows, the bonding structure 28' is filled in the first group of third insulating openings 701' to contact the ring-shaped electrode layer 30b' and/or the first conductive region 60a' and filled in the second group of third insulating openings 702 to contact the connecting electrode layer 30c' and/or the third conductive region 60d'. As a result, the conductive substrate 12 electrically connects to the first semiconductor layer 101.

When the bonding structure 28' is formed, the connecting electrode layer 30c' can reduce the gap caused by the thicknesses of the insulating layer 70', the conductive layer 60', the second insulating layer 50' and the reflective structure 16 in the second group of third insulating openings 702 to improve the yield of the bonding process. In an embodiment of the present application, the electrode layer 30' does not include the connecting electrode layer 30c' and the bonding structure 28' is filled in the second group of third insulating openings 702 to direct contact the third conductive region 60d'. When the bonding step is performed, the conductive substrate 12 can also electrically connects to the first semiconductor layer 101.

As the manufacturing method of the light-emitting device 1 described above, in an embodiment of the present application, the formation of the first metal layer 26a of the light-emitting device 2 can be accomplished by forming metal materials in sequence on different regions of the stack 2'.

As the manufacturing method of the light-emitting device 1 described above, in an embodiment of the present application, in the bonding method, the upside of the stack 2' can be turned down and aligning and bonding the conductive substrate 12, or the upside of the conductive substrate 12 can be turned down and aligning and bonding the stack 2'.

Following the roughening step, as a cross-sectional view in FIG. 17A shows, the manufacturing method of the light-emitting device 2 includes a step of forming a wire-bonding pad 36'. First, as the manufacturing method of the light-emitting device 1 described above, the non-closed opening 38 is formed. From the top view, the non-closed opening 38 substantially corresponds to the region of the electrode pad 30a' other than the electrode pad protrusion portion 303. Before the non-closed opening 38 is formed, the first surface S1 of the surrounding exposed region 15 includes a width W1 which is larger than the width W2 of the non-closed opening 38. After the surrounding exposed region 15 and the non-closed opening 38 are formed successively, the electrode pad 30a' connects to the first surface S1 and formed in the surrounding exposed region 15 to correspond to the non-closed opening 38. The electrode pad 30a' has a width W3 larger than the width W2. The electrode pad protrusion portion 303 directly contacts and connects to the second conductive protrusion portion 603 to electrically connect to the second semiconductor layer 102. The top surface 301' of the electrode pad 30a' includes an exposed region 301b' exposed by the non-closed opening 38, which does not overlap with the semiconductor stack 10. The thickness of the first semiconductor layer 101 can be 3~4 μm and be divided into a first portion 101a and a second portion 101b. The thickness of the first portion 101a is substantially equal to the depth of the non-closed opening 38, which is about 1.5 to 3 μm. The thickness of the second portion 101b corresponding to the surrounding exposed region 15 is about 1 to 1.5 μm. The electrode pad 30a' can be electrically connected to the second semiconductor layer 102 but not formed on the light-emitting surface so as not to shield the light of the light-emitting device 2. In an embodiment of the present application, the electrode layer 30 includes one or more electrode pads 30*a*' and the one or more electrode pads 30*a*' can be formed on one or more corners of the growth substrate 11.

In an embodiment of the present application, the other portion of the first semiconductor layer 101 can be further etched and removed, while the portion of the first semiconductor layer 101 on the electrode pad 30*a*' is removed to form the non-closed opening 38, and to expose a portion of the third insulating layer 70' as a scribing line for the subsequent scribing step. The position and size of each light-emitting device 2 are defined by a plurality of scribing lines.

Next, as FIG. 17B shows, the wire-bonding pad 36 is formed on the exposed region 301*b*'. The structure, position and function of the wire-bonding pad 36 are the same as described in the light-emitting device 1, and thus is not described again.

Following the step of forming the wire-bonding pad 36, the manufacturing method of the light-emitting device 2 includes a step of forming a passivation layer 80. After the step of forming a passivation layer 80, the wafer-scale conductive substrate 12 can be scribed. The scribing step includes cutting the passivation layer 80, the conductive substrate 12 and the bonding structure 28' through the scribing lines to form a plurality of light-emitting devices 2. The scribing lines are formed by etching the first semiconductor layer 101 in the step of forming the non-closed opening 38 mentioned above. The cutting process includes blade cutting or laser cutting. Furthermore, the wavelength conversion layer 42 is formed optionally on the passivation layer 80 prior to the scribing step.

The light-emitting device 2, as shown in FIG. 17B, is formed by the manufacturing method of the embodiment. When an external current is injected into the light-emitting device 2 through the wire-bonding pad 36 and the conductive substrate 12, the current is first conducted to the electrode pad 30*a*', spread in the second conductive region 60*b*' by the electrode pad protrusion portion 303 contacting the second conductive protrusion portion 603 and then conducted to the second semiconductor layer 102. Furthermore, the current is conducted simultaneously to the first semiconductor layer 101 in the surrounding exposed region 15 and in the via-like exposed region 17 by means of the third conductive region 60*d*' surrounding the ring-shaped first conductive region 60*a*'. As a result, the current can be uniformly spread in the first semiconductor layer 101 to uniformly distribute the light field and reduce the forward voltage of the light-emitting device 2. The third insulating layer 70' can isolate the electrode pad 30*a*' and the second conductive region 60*b*' from the second semiconductor layer 102, and the electrode pad 30*a*', the ring-shaped electrode layer 30*b*' and the active layer 103 are located in different regions of the light-emitting device 2 in a horizontal direction. As shown in FIG. 17B, the semiconductor stack 10 is turned over and disposed on the conductive substrate 12, and thus the whole active layer 103 is located on the reflective structure 16 and the second conductive region 60*b*'. The wire-bonding pad 36 is formed in the non-closed opening 38 and corresponds to the electrode pad 30*a*'. In the light-emitting device 2, there is no electrode structure formed on the light-emitting surface corresponding to the active layer 103. Therefore, the light emitted from the active layer 103 is not shielded by the electrode structure of the light-emitting device 2 and the light-emitting efficiency is enhanced.

The principle and the efficiency of the present application illustrated by the embodiment above are not the limitation of the application. Any person having ordinary skill in the art can modify or change the aforementioned embodiments. Therefore, the protection range of the rights in the present application will be listed as the following claims.

What is claimed is:

1. A light-emitting device, comprising:
    a semiconductor stack comprising a first semiconductor layer, a second semiconductor layer, and an active layer formed therebetween;
    a surrounding exposed region formed on peripheries of the semiconductor stack, exposing a portion of the first semiconductor layer;
    a conductive layer formed on the second semiconductor layer, comprising a first conductive region extending toward and contacting the portion of the first semiconductor layer in the surrounding exposed region;
    an electrode layer formed on the first conductive region of the conductive layer in the surrounding exposed region, surrounding the semiconductor stack, contacting the conductive layer and comprising an electrode pad wherein the electrode pad comprises an exposed region not overlapping the semiconductor stack;
    an outside insulating layer covering a portion of the conductive layer and the electrode layer, and comprising a first opening exposing the other portion of the conductive layer;
    a bonding layer covering the outside insulating layer and electrically connecting to the other portion of the conductive layer through the first opening; and
    a conductive substrate, wherein the semiconductor stack is located on one side of the bonding layer, and the conductive substrate is located on the other side of the bonding layer.

2. The light-emitting device of claim 1, further comprising one or more via-like exposed regions formed within the semiconductor stack and exposing the first semiconductor layer, and the conductive layer contacting the first semiconductor layer in the one or more via-like exposed regions.

3. The light-emitting device of claim 2, wherein the first conductive region is ring-shaped, and the conductive layer further comprises a second conductive region and a third conductive region spatially separated from the first conductive region, wherein the second conductive region electrically connects to the second semiconductor layer and the third conductive region contacts the first semiconductor layer in the one or more via-like exposed regions.

4. The light-emitting device of claim 3, wherein the electrode layer further comprises a ring-shaped electrode layer spatially separated from the electrode pad and the ring-shaped electrode contacts the first conductive region and the electrode pad contacts a portion of the second conductive region.

5. The light-emitting device of claim 4, wherein the first opening exposes the ring-shaped electrode layer and/or the first conductive region.

6. The light-emitting device of claim 3, wherein the outside insulating layer further comprises a second opening and the second opening exposes the third conductive region.

7. The light-emitting device of claim 6, wherein the electrode layer further comprises a connecting electrode layer spatially separated from the electrode pad and the ring-shaped electrode layer, and the connecting electrode layer is formed in the second opening.

8. The light-emitting device of claim 1, wherein the conductive layer further comprises a second conductive region spatially separated from the first conductive region, and the second conductive region electrically connects to the second semiconductor layer.

9. The light-emitting device of claim 8, wherein the other portion of the conductive layer is the second conductive region and the first opening exposes the second conductive region.

10. The light-emitting device of claim 9, wherein the bonding layer electrically connects to the second conductive region.

11. The light-emitting device of claim 1, further comprising an inside insulating layer formed between the conductive layer and the semiconductor stack.

12. The light-emitting device of claim 1, wherein the electrode layer further comprises a ring-shaped electrode layer connected to the electrode pad and the ring-shaped electrode layer contacts the first conductive region.

13. The light-emitting device of claim 12, wherein the electrode layer further comprises a connecting electrode layer spatially separated from the electrode pad, and the connecting electrode layer is formed in the first opening.

14. The light-emitting device of claim 1, further comprising a reflective structure formed on the second semiconductor layer.

15. The light-emitting device of claim 1, further comprising a current spreading layer formed on the second semiconductor layer.

16. The light-emitting device of claim 1, wherein the electrode pad is formed on a side of the light-emitting device.

17. The light-emitting device of claim 1, wherein the electrode pad is formed on a corner of the light-emitting device.

18. The light-emitting device of claim 1, further comprising a wire-bonding pad formed on the exposed region of the electrode pad.

* * * * *